(12) United States Patent
Pyeon

(10) Patent No.: US 8,467,486 B2
(45) Date of Patent: Jun. 18, 2013

(54) MEMORY CONTROLLER WITH FLEXIBLE DATA ALIGNMENT TO CLOCK

(75) Inventor: Hong Beom Pyeon, Kanata (CA)

(73) Assignee: MOSAID Technologies Incorporated, Ottawa, Ontario (CA)

(*) Notice: Subject to any disclaimer, the term of this patent is extended or adjusted under 35 U.S.C. 154(b) by 1057 days.

(21) Appl. No.: 12/325,074

(22) Filed: Nov. 28, 2008

(65) Prior Publication Data

US 2009/0154285 A1 Jun. 18, 2009

Related U.S. Application Data

(63) Continuation-in-part of application No. 12/168,091, filed on Jul. 4, 2008.

(60) Provisional application No. 61/013,784, filed on Dec. 14, 2007, provisional application No. 61/039,605, filed on Mar. 26, 2008, provisional application No. 61/019,907, filed on Jan. 9, 2008.

(51) Int. Cl.
H04L 7/00 (2006.01)
(52) U.S. Cl.
USPC .......................................... 375/354; 375/372
(58) Field of Classification Search
USPC ............ 375/354, 356, 355, 368, 372; 710/36; 711/103, 105, 154
See application file for complete search history.

(56) References Cited

U.S. PATENT DOCUMENTS

| | | |
|---|---|---|
| 5,249,270 A | 9/1993 | Stewart et al. |
| 5,404,460 A | 4/1995 | Thomsen et al. |
| 5,430,859 A | 7/1995 | Norman et al. |
| 5,475,854 A | 12/1995 | Thomsen et al. |
| 5,613,077 A | 3/1997 | Leung et al. |
| 5,729,683 A | 3/1998 | Le et al. |
| 5,768,173 A | 6/1998 | Seo et al. |
| 5,806,070 A | 9/1998 | Norman et al. |

(Continued)

FOREIGN PATENT DOCUMENTS

| | | |
|---|---|---|
| CN | 1744228 A | 3/2006 |
| CN | 1909442 A | 2/2007 |

(Continued)

OTHER PUBLICATIONS

Diamond, "SyncLink: High-speed DRAM for the future", Micro Standards, IEEE Micro, Dec. 1996, pp. 74-75.

(Continued)

*Primary Examiner* — Emmanuel Bayard
(74) *Attorney, Agent, or Firm* — Curtis B. Behmann; Borden Ladner Gervais LLP

(57) ABSTRACT

A system includes a memory controller and a plurality of memory devices that are connected in-series to the memory controller. The system operation is synchronous with clock that is provided in a fashion of source synchronous clock structure. The source synchronous clock structure includes a PLL (Phase-Locked Loop) that reshapes an incoming clock and a reshaped clock is provided. The PLL provides a shifted clock in phase of 90°. The phase-shifted clock and data are transmitted from the first device to the second device. Clock phase shift provides a center-edge clock with data to be transmitted. The devices are assigned with unique IDs. The least significant bit of the ID number of the last device is used for determination of clock alignment: edge- or center-aligned clock with data produced by the memory controller.

18 Claims, 22 Drawing Sheets

U.S. PATENT DOCUMENTS

| | | | |
|---|---|---|---|
| 6,034,878 | A | 3/2000 | Osaka et al. |
| 6,052,331 | A | 4/2000 | Araki et al. |
| 6,144,576 | A | 11/2000 | Leddige et al. |
| 6,148,363 | A | 11/2000 | Lofgren et al. |
| 6,205,191 | B1 | 3/2001 | Portmann et al. |
| 6,255,859 | B1 | 7/2001 | Haq |
| 6,301,322 | B1 | 10/2001 | Manning |
| 6,304,921 | B1 | 10/2001 | Rooke |
| 6,317,812 | B1 | 11/2001 | Lofgren |
| 6,442,644 | B1* | 8/2002 | Gustavson et al. .......... 711/105 |
| 6,493,250 | B2 | 12/2002 | Halbert et al. |
| 6,504,790 | B1 | 1/2003 | Wolford |
| 6,505,149 | B1 | 1/2003 | Griswold et al. |
| 6,668,292 | B2 | 12/2003 | Meyer et al. |
| 6,715,044 | B2 | 3/2004 | Lofgren |
| 6,782,459 | B1 | 8/2004 | Ware |
| 6,791,360 | B2 | 9/2004 | Gauthier et al. |
| 6,799,235 | B2 | 9/2004 | Bormann et al. |
| 6,813,724 | B2 | 11/2004 | Saito |
| 6,889,334 | B1 | 5/2005 | Magro et al. |
| 6,889,335 | B2 | 5/2005 | Hargis et al. |
| 6,928,504 | B2 | 8/2005 | Peacock |
| 6,937,680 | B2 | 8/2005 | Fong et al. |
| 6,940,760 | B2 | 9/2005 | Borkenhagen et al. |
| 6,944,697 | B2 | 9/2005 | Andreas |
| 6,950,325 | B1 | 9/2005 | Chen |
| 6,990,562 | B2 | 1/2006 | Rentschler et al. |
| 7,031,221 | B2 | 4/2006 | Mooney |
| 7,032,039 | B2 | 4/2006 | DeCaro |
| 7,062,625 | B1 | 6/2006 | Shrader et al. |
| 7,069,370 | B2 | 6/2006 | Sukegawa et al. |
| 7,076,677 | B2 | 7/2006 | Falconer et al. |
| 7,103,793 | B2 | 9/2006 | Rentschler et al. |
| 7,110,423 | B1 | 9/2006 | Sethuram et al. |
| 7,139,308 | B2 | 11/2006 | Doblar et al. |
| 7,145,362 | B1 | 12/2006 | Bergendahl et al. |
| 7,168,027 | B2 | 1/2007 | Lee et al. |
| 7,171,534 | B2 | 1/2007 | Hargis et al. |
| 7,184,483 | B2 | 2/2007 | Rajan |
| 7,198,197 | B2 | 4/2007 | Best |
| 7,212,423 | B2 | 5/2007 | Vogt |
| 7,219,205 | B2 | 5/2007 | Ware |
| 7,257,725 | B2 | 8/2007 | Osaka et al. |
| 7,280,589 | B2 | 10/2007 | Smith et al. |
| 7,280,628 | B1 | 10/2007 | Gupta et al. |
| 7,483,506 | B2 | 1/2009 | Yajima et al. |
| 7,561,651 | B1 | 7/2009 | Karabatsos |
| 7,606,110 | B2 | 10/2009 | Han et al. |
| 7,657,713 | B2* | 2/2010 | Park et al. .......... 711/154 |
| 2001/0009530 | A1 | 7/2001 | Maeda |
| 2001/0014922 | A1* | 8/2001 | Kuge .......... 710/36 |
| 2001/0050856 | A1 | 12/2001 | Matsuzaki |
| 2002/0067654 | A1 | 6/2002 | Grundon et al. |
| 2003/0099138 | A1 | 5/2003 | Kyung |
| 2003/0128784 | A1 | 7/2003 | Takabayashi |
| 2004/0017401 | A1* | 1/2004 | Strong et al. .......... 345/821 |
| 2004/0160852 | A1* | 8/2004 | Sasagawa .......... 365/233 |
| 2005/0270907 | A1* | 12/2005 | Yuzawa et al. .......... 368/10 |
| 2006/0044927 | A1* | 3/2006 | Han et al. .......... 365/232 |
| 2006/0226871 | A1* | 10/2006 | Ito et al. .......... 326/38 |
| 2007/0008791 | A1 | 1/2007 | Butt et al. |
| 2007/0028059 | A1* | 2/2007 | Gregorius .......... 711/154 |
| 2007/0030508 | A1* | 2/2007 | Asauchi .......... 358/1.14 |
| 2007/0064462 | A1* | 3/2007 | Matsui .......... 365/63 |
| 2007/0076479 | A1 | 4/2007 | Kim |
| 2007/0076502 | A1 | 4/2007 | Pyeon |
| 2007/0083701 | A1 | 4/2007 | Kapil |
| 2007/0086268 | A1 | 4/2007 | Shaetfer et al. |
| 2007/0096774 | A1 | 5/2007 | Yang et al. |
| 2007/0109908 | A1 | 5/2007 | Best |
| 2007/0165138 | A1* | 7/2007 | Huang et al. .......... 348/441 |
| 2007/0186034 | A1 | 8/2007 | Mes |
| 2007/0233903 | A1 | 10/2007 | Pyeon |
| 2007/0234071 | A1 | 10/2007 | Pyeon |
| 2007/0260841 | A1* | 11/2007 | Hampel et al. .......... 711/167 |
| 2008/0016269 | A1* | 1/2008 | Chow et al. .......... 711/103 |
| 2008/0086590 | A1* | 4/2008 | Urabe .......... 711/103 |
| 2009/0052599 | A1 | 2/2009 | Yanagisawa et al. |
| 2009/0125790 | A1* | 5/2009 | Iyer et al. .......... 714/773 |
| 2010/0058124 | A1* | 3/2010 | Porterfield .......... 714/700 |
| 2010/0239059 | A1 | 9/2010 | Sugimoto et al. |

FOREIGN PATENT DOCUMENTS

| | | |
|---|---|---|
| JP | 2003202936 | 7/2003 |
| JP | 2007536773 | 12/2007 |
| WO | 2005106888 | 11/2005 |
| WO | 2005106888 A1 | 11/2005 |
| WO | 2007002092 | 1/2007 |
| WO | 2007036048 A1 | 4/2007 |
| WO | 2007099678 | 9/2007 |
| WO | 2007109886 A1 | 10/2007 |
| WO | 2007013444 A1 | 11/2007 |
| WO | 2008000237 | 1/2008 |
| WO | 2008002108 | 1/2008 |
| WO | 2008022454 A1 | 2/2008 |
| WO | 2008067652 A1 | 6/2008 |
| WO | 2008074126 A1 | 6/2008 |
| WO | 2009069244 | 6/2009 |

OTHER PUBLICATIONS

Gjessing et al., "A RAM link for high speed", Special Report/Memory, IEEE Spectrum, Oct. 1992, pp. 52-53.

Gjessing et al., "RamLink: A High-Bandwidth Point-to-Point Memory Architecture", IEEE 0-8186-2655-0/92, Feb. 24-28, 1992, pp. 328-331.

Gjessing et al., "Performance of the RamLink Memory Architecture", Proceedings of the Twenty-Seventh Annual Hawaii International Conference on System Sciences, IEEE 1060-3424/94, Jan. 4, 1994, pp. 154-162.

Maneatis, "Low-Jitter Process-Independent DLL and PLL based on Self-Biased Techniques", IEEE Journal of Solid-State Circuits, vol. 31, No. 11, Nov. 1996, pp. 1723-1732.

Oshima et al., "High Speed Memory Architectures for Multimedia Applications", Circuits and Devices, IEEE 8755/3996/97/, Jan. 1997, pp. 8-13.

Kennedy, J., et al., "A 2Gb/s Point-to-Point Heterogeneous Voltage Capable DRAM Interface for Capacity-Scalable Memory Subsystems," ISSCC 2004/Session 1/Dram/11.8, IEEE International Solid-State Circuites Conference, vol. 1, Feb. 17, 2004, 10 pages.

Kim, Jae-Kwan, et al., "A 3.6 Gb/s/pin Simulataneous Bidirectional (SBD) I/O Interface for High-Speed Dram", ISSCC 2004/Session 22/DSL and Multi-Gb/s I/O 22.7, IEEE International Solid State Circuits Conference, vol. 1Feb. 18, 2004, 8 pages.

King, et al., "Communicating with Daisy Chained MCP42XXX Digital Potentiometers", Microchip Technology Inc. AN747, Jan. 30, 2001, pp. 1-8.

"1024K12C™ CMOS Serial EEPROM," 24AA1025/24LC1025/24FC1025, Technical Specification, Microchip Technology Inc., Feb. 16, 2006, pp. 1-22.

Portmann et al., "A Multiple Vendor 2.5-V DLL for 1.6-GB/s RDRAMs", Rambus Inc., 2465 Latham St., Mountain View, CA 94040: 1999 VLSI Circuits Symposium, Jun. 17-19, 1999, Kyoto, Japan, 4 pages.

Tam et al., "Clock Generation and Distribution for the Third Generation Itanium (R) Processor", Intel Corporation, 2200 Mission College Blvd. (SC12-408), Santa Clara, CA 95052, U.S.A., Jun. 2003, pp. 9-12.

Intel Corporation, "How to Use OTP Registers for Security Applications", Application Note 717, Order No. 292265-001, Oct. 1999, 10 pages.

Intel Corporation, "Clocking—Lecture 2 and 3, Purpose—Clocking Design Topics", http://download.intel.com/education/highered/signal/ELCT865/Class2_3_4_Clocking.ppt, Dec. 4, 2002, pp. 1-42.

Atmel, "8-megabit 2.5-volt Only or 2.7-volt Only DataFlash®," AT45DB081B, Technical Specification, Rev. 2225H-DFLSH, Oct. 2004, pp. 1-33.

Silicon Storage Technology, "2 Mbit, Low Voltage, Serial Flash Memory With 40MHz SPI Bus Interface", M25P20, Aug. 2005, pp. 1-40.

Silicon Storage Technology Inc., "16 Mbit SPI Serial Flash," SST25VF016B, Preliminary Specification, Apr. 2005, pp. 1-28.

Philips Semiconductors, "The I2C-Bus Specification," Version 2.1, Jan. 2000, pp. 1-46.

Samsung Electronics, "DDR2 Fully Buffered DIMM 240pin FBDIMMS based on 512Mb C-die", (RoHS compliant), Rev. 1.3, Sep. 2006, pp. 1-32.

Samsung Electronics, "K9XXG08UXM Preliminary Flash Memory," K9K8G08U1M, K9F4G08U0M, Technical Specification, May 3, 2005, pp. 1-43.

Spansion LLC, "S70GL0IGN00 MirrorBit Flash", Publication No. S70GL0IGN00_00, Revision A, Amendment I, Issue Date Jun. 1, 2005, 83 pages.

"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., Mar. 1996, 98 pages.

"Intel StrataFlash Wireless Memory (L18)",—28F640L18, 28F128L18, 28F256L18, Order No. 251902, Revision: 010, Aug. 2005, 106 pages.

IBM Corporation, "A Practical Guide to Serial Storage Architecture for AIX", International Technical Support Organization, First Edition, Jul. 1996, 196 pages.

Hyper Transport TM I/O Link Specification, Revision 3.00, Document No. HTC20051222-0046-0008, HyperTransport Technology Consortium, Apr. 21, 2006, pp. 1-428.

"HyperTransport TM I/O Link Specification", Revision 3.00a, Document No. HTC20051222-0046-0017, Hypertransport Technology Consortium, Nov. 22, 2006, pp. 1-443.

Atmel, AN747, "Communication with Daisy Chained MCP42XXX Digital Potentiometers", 2001, Microchip Technology Inc., 8 pages.

IEEE, "A 2GB/s Point-to-Point Heterogeneous Voltage DRAM Interface for Capacity-Scalable Memory Subsystems" 2004 IEEE International Solid-State Circuits Conference, 10 pages.

IEEE, "A 3.6Gb/S/pin Simultaneous Bidirectional (SBD) I/O Interface for High-Speed DRAM", 2004 IEEE International Solid-State Circuits Conference, 8 pages.

* cited by examiner

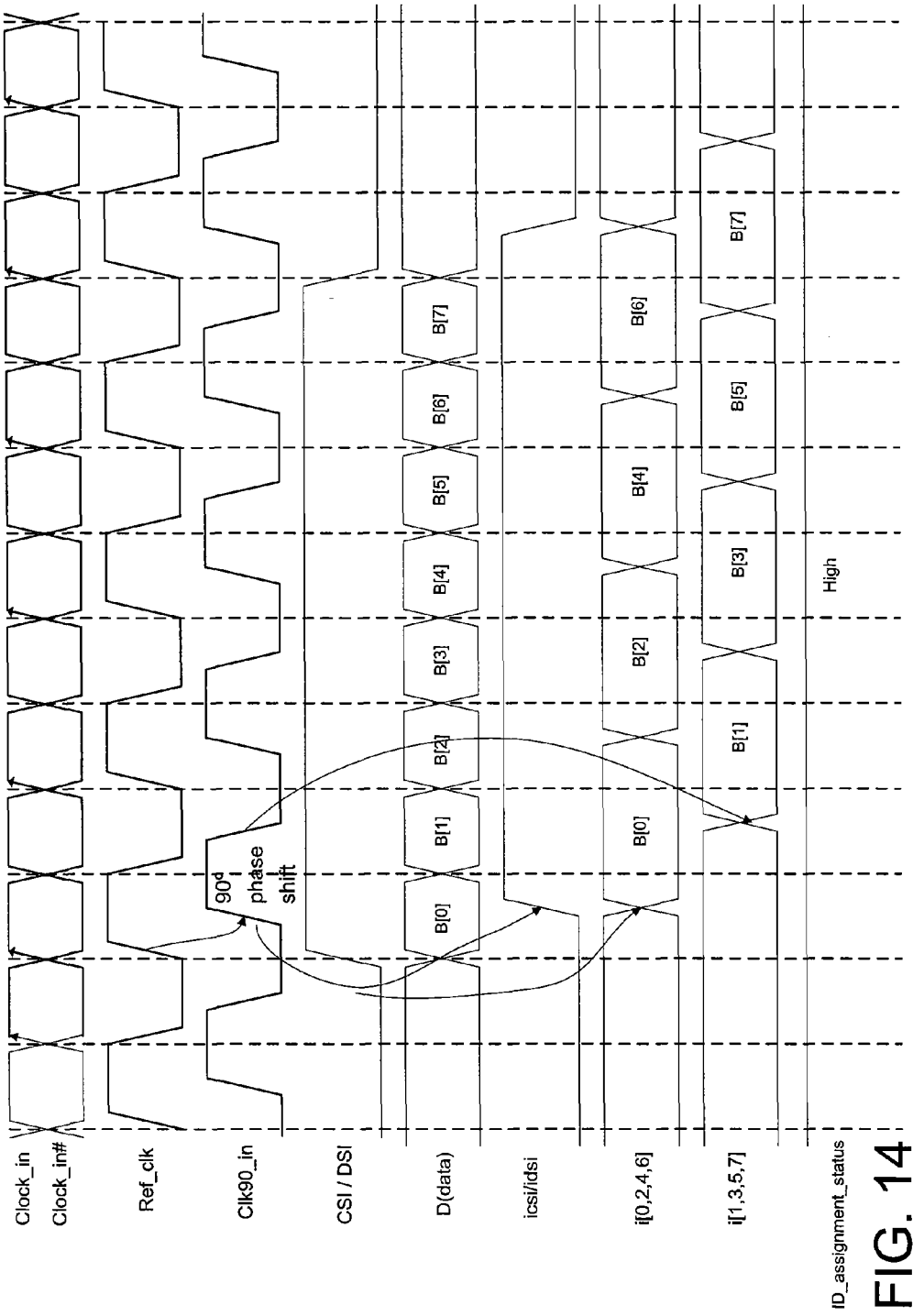

MEMORY CONTROLLER WITH FLEXIBLE DATA ALIGNMENT TO CLOCK

CROSS REFERENCE TO RELATED APPLICATIONS

This application claims the benefit of priority of U.S. Provisional Patent Application No. 61/013,784 filed Dec. 14, 2007, U.S. Provisional Patent Application No. 61/019,907 filed Jan. 9, 2008, and U.S. Provisional Patent Application No. 61/039,605 filed Mar. 26, 2008, and is a continuation-in-part of U.S. patent application Ser. No. 12/168,091 filed Jul. 4, 2008, the disclosures of each of which are expressly incorporated herein by reference in their entirety.

TECHNICAL FIELD

The present invention relates to a semiconductor device. More particularly, it relates to a system having a plurality of semiconductor devices and timing and clocking methods for use in such systems.

BACKGROUND

Electronic equipment uses semiconductor devices, such as, for example, memory devices. Memory devices may include random access memories (RAMs), flash memories (e.g., NAND flash device, NOR flash device), and other types of memories for storing data or information.

Memory systems on system boards are designed to incorporate higher density and faster operation due to the demands of applications that operate on the system boards. Two design techniques that may be employed to incorporate higher density of a memory system on a system board include using: serial connection configuration, such as, for example, cascading; and parallel interconnection configuration, such as, for example, multi-dropping. These design techniques may be used to overcome the density issue that determines the cost and operating efficiency of memory swapping between a hard disk and a memory system.

Various clocking methods can be used in such systems. Using a common source clock, the clock signal can become distorted due to the parallel nature of this arrangement. As well, it has several skew factors, has a limited operating frequency range when many devices are connected in a multi-drop fashion, and may not be used in high-speed applications. A source synchronous clocking system, using clock reshaping and retransmission, provides a higher frequency operating range and avoids some of the common synchronous clock skew factors, but introduces other skew factors that do not seriously affect the performance of the system.

SUMMARY

In accordance with one aspect of the present invention, there is provided an apparatus for communicating with a plurality of devices connected in-series that employs source synchronous clocking, the apparatus comprising: an information detector for detecting number information relating to the number of devices connected in-series; and a clock producer for producing a clock signal in response to the detected number information, the produced clock signal being used for synchronizing communication between the apparatus and the devices.

For example, the information detector comprises an identifier detector for detecting a device identifier (ID) associated with one of the series-connected devices and providing the detected device ID as the detected number information to the clock producer. The identifier detector may comprise a bit information detector for detecting information on one of bits included in the device ID.

The bit information detector may comprise a bit number determiner for determining whether a least significant bit (LSB) of the device ID is "1" or "0" and providing a determination result as the detected number information, the aligned clock signal being produced in response to the determination result.

The apparatus may further comprise a mode detector for receiving a signal presenting the status of completion of ID assignment, determining whether the ID assignment is completed and providing the status of the ID assignment completion to the bit determiner to determine the LSB of the registered device ID.

For example, the clock producer produces either edge-aligned or center-aligned clock signal with data in response to detection that a device identifier assignment is completed or in progress, the apparatus providing a strobe signal for controlling data input to and output from the device, the data being transmitted in synchronization with the clock signal.

In accordance with another aspect of the present invention, there is provided a method for communicating with a plurality of devices connected in-series that employs source synchronous clocking, the method comprising: detecting number information relating to the number of devices connected in-series; and producing a clock signal in response to the detected number information, the produced clock signal being used for synchronizing the communication with devices.

The method may further comprise: assigning a unique device identifier (ID) associated with each of the series-connected devices, the assigned IDs of the devices being consecutive; detecting a device ID associated with one of the series-connected devices; and providing the detected device ID as the detected number information. The step of detecting a device ID may comprise detecting information on one of bits included in the device ID in response to a detection of completion of the device IDs.

In accordance with another aspect of the present invention, there is provided a system comprising: a plurality of series-connected devices that employs source synchronous clocking; and a controller configured to communicate with the series-connected devices, the controller including: an information detector for detecting number information relating to the number of devices connected in-series; and a clock producer for producing a clock signal in response to the detected number information, the produced clock signal being used for synchronizing communication between the controller and the devices.

In accordance with one embodiment of the present invention, there is provided a system including a memory controller and at least one semiconductor device.

In accordance with another embodiment, there is provided a semiconductor memory device with flexible operation of flash memories, for example, NAND flash devices.

In accordance with another embodiment, there is provided a system including a memory controller and a plurality of memory devices that are connected in-series to the memory controller. The system is operated with source synchronous clock structure. The memory controller includes a PLL (Phase-Locked Loop) that produces 90°, 180°, 270° and 360° phase shift from an input oscillation signal. Some of those phase shift signals are used for clock alignment. The devices are assigned with unique and consecutive identifier (ID) numbers. The least significant bit of the ID number of the last device is used for determination of clock alignment: edge- or center-aligned clock with data produced by the memory controller.

Other aspects and features of the technique will become apparent to those ordinarily skilled in the art upon review of the following description of specific embodiments of the present invention in conjunction with the accompanying figures.

BRIEF DESCRIPTION OF THE DRAWINGS

Embodiments of the present invention will now be described with reference to the attached drawings in which:

FIG. 14 shows a timing diagram of clock generation from memory controller after ID generation and LSB of ID=1 in accordance with an example embodiment;

DETAILED DESCRIPTION

In the following detailed description of sample embodiments of the invention, reference is made to the accompanying drawings which form a part hereof, and in which is shown by way of illustration specific sample embodiments in which the present invention may be practiced. These embodiments are described in sufficient detail to enable those skilled in the art to practice the present invention, and it is to be understood that other embodiments may be utilized and that logical, mechanical, electrical, and other changes may be made without departing from the scope of the present invention. The following detailed description is, therefore, not to be taken in a limiting sense, and the scope of the present invention is defined by the appended claims.

Generally, the present invention provides a system having a controller and a plurality of devices that are connected, where the devices are clocked with a synchronous method, such as a source synchronous method. Example systems having semiconductors connected in-series will be described.

Figure 1:
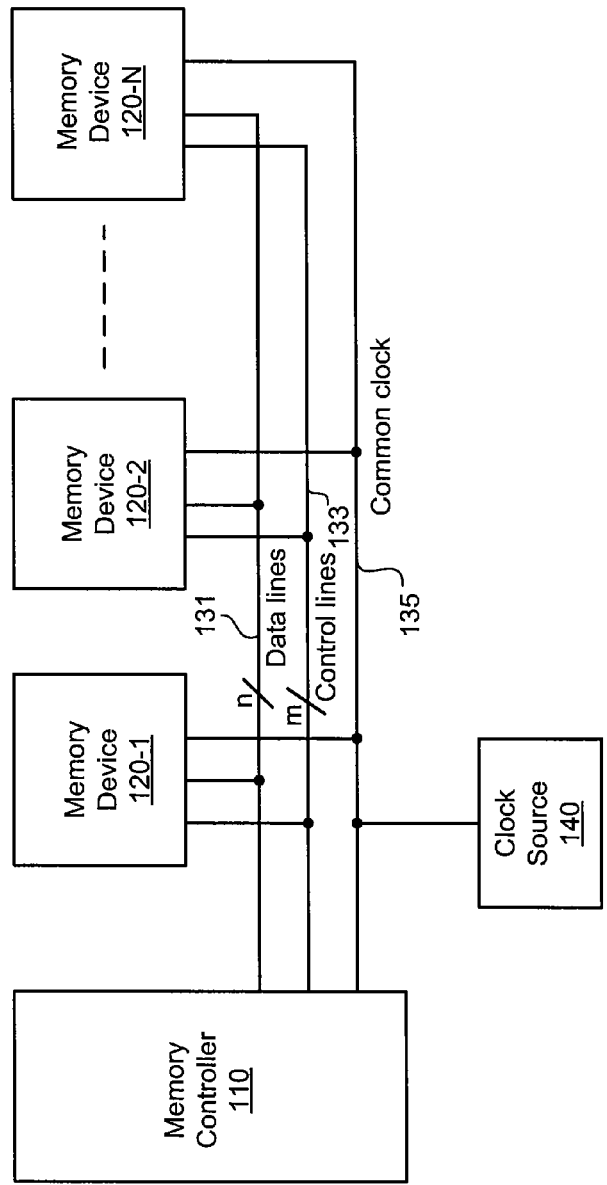
FIG. 1 is a block diagram of a system having a plurality of memory devices connected in a multi-drop fashion, with common synchronous clock structure.

FIG. 1 shows a memory system with synchronous clock connection with common clock source. The system has a plurality of memory devices connected in a multi-drop fashion. In the illustrated system, a memory controller 110 communicates with a plurality (N) of memory devices 120-1, 120-2, - - - , 120-N, N being an integer greater than one. The memory controller 110 and the N memory devices are connected through n-bit data lines 131 and m-bit control lines 133. The data transfers and controls between them are synchronized with common clocks on common clock line 135 that is connected to the memory controller 110 and the N memory devices 120-1-120-N. The common and synchronous clocks are provided by a clock source 140 to the common clock line 135. To operate, clocks are provided as common synchronous clock structure. A common source clock is provided to the memories. Because of the parallel nature of this arrangement, a clock signal can become distorted. The distortion of a clock signal is induced when the clock signal is supplied from the common clock signal generator for all memories and the memory controller.

Figure 2:
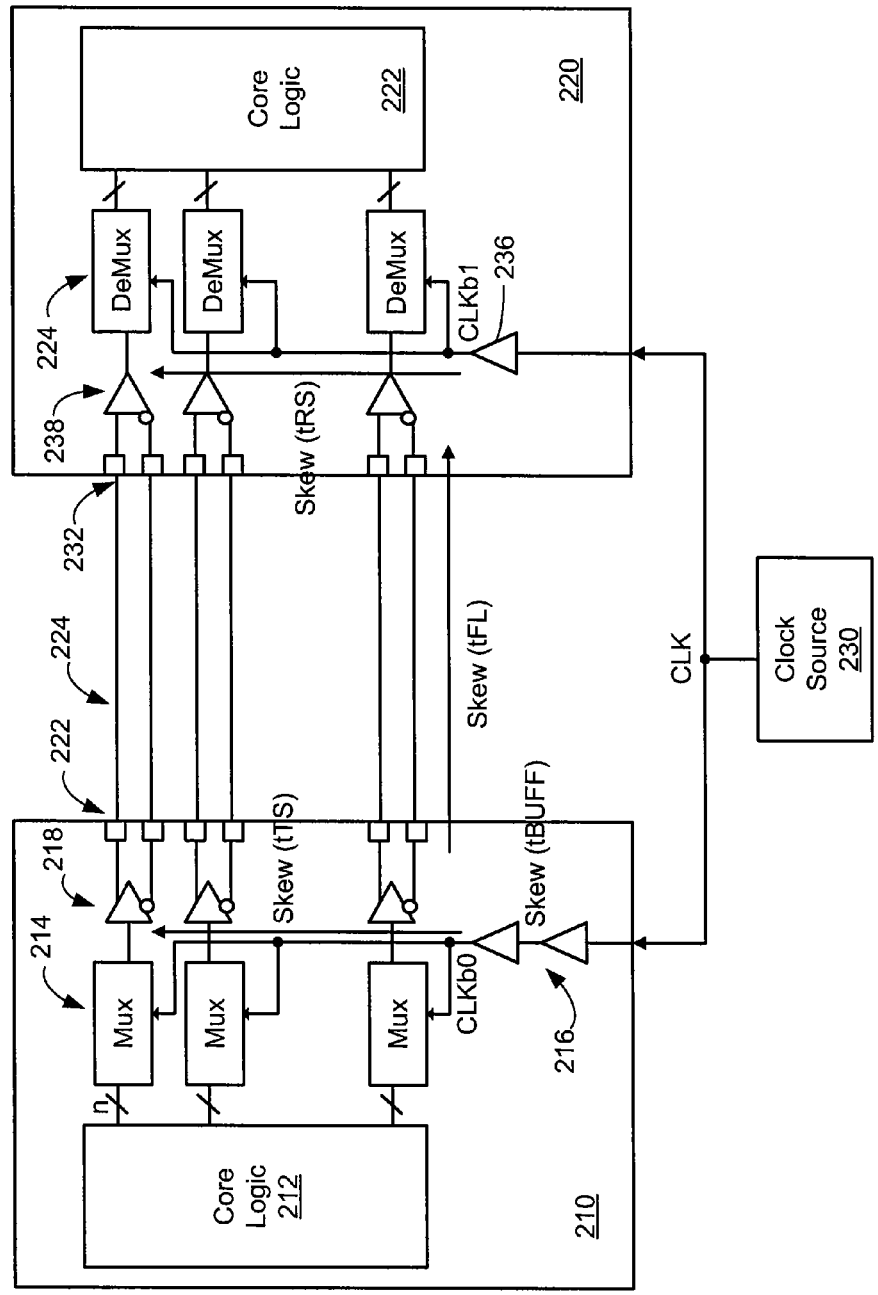
FIG. 2 is a block diagram showing two memory devices parallel-connected, with a common synchronous clock source.

FIG. 2 depicts a common synchronous clock structure. The illustrated example includes two devices that are interconnected. One of the devices shows its output interface circuitry in detail, and the other shows its input interface circuitry in detail. Referring to FIG. 2, one device 210 has core logic circuitry 212 and a plurality of multiplexers (Muxs) 214. Similarly, the other device 220 has core logic circuitry 222 and a plurality of demultiplexers (DeMuxs) 224. In the illustrated example, the device 210 functions as a "transmitter" and its core logic circuitry 212 operates as a "transmitter logic circuit". Similarly, the device 220 functions as a "receiver" and its core logic circuitry 222 operates as a "receiver logic circuitry". A clock source 230 provides common synchronous clock CLK to both devices 210 and 220. The data transfers from the device 210 and the data received by the devices 220 are synchronized by the clock CLK provided by the clock source 230. In the illustrated example, each of the core logic circuitry 212 and 222 includes control/processing unit and data store elements (not shown) for device operations.

In the device 210, the clock CLK is fed to buffers 216 which in turn provides buffered output clock CLKb0 commonly to the multiplexers 214 for multiplexing operation. Data (n bits) from the core logic circuitry 212 is multiplexed by the multiplexers 214 and multiplexed data output from each of the multiplexers 214 is output through each of output buffers 218. Each of the output buffers has two outputs for providing one output signal and its complementary output signal. Each output data is transmitted through a pair of pins 222 of the device 210 to lines 224 that are connected to a pair of pins 232 of the device 220.

In the device 220, the clock CLK is fed to a buffer 236, which in turn provides buffered output clock CLKb1 commonly to the demultiplexers 224 for demultiplexing operation. The data received at the pair of pins 232 is provided to a corresponding input buffer 238 that provides buffered output data to the corresponding demultiplexer 224. The demultiplexed data (n bits) from each of the demultiplexers 224 is provided to the core logic circuitry 222. The operations of the multiplexers 214 of the device 210 and the demultiplexers 224 of the device 220 are synchronized by the clock CLK provided by the clock source 230.

The common synchronous clock structure has several skew factors as illustrated in FIG. 2, such as:

(i) tBUF (clock insertion time from clock input pad to the final clock driver placed into the synchronous circuitry),
(ii) tTS (transmitter skew in the transmitter logic), tRS (receiver skew among input buffers in the receiver logic), tFL (fly time skew between transmitter and receiver), and
(iii) tJITTER (clock jitter due to power level change, instant electrical characteristics change from the clock signal line, and data type change of input and output ports connected to clock).

Therefore, it has a limited operating frequency range when many devices are connected in a multi-drop fashion at high speed frequency.

The common synchronous clock structure has drawbacks due to the signal integrity issues like slow transition, low noise immunity, clock phase shift, and clock waveform distortion from the transmission line effect and memory device loading. Therefore, the common synchronous clock system with the single clock source as shown in FIG. 2 may not be applicable to high-speed applications, if many devices are connected together with and driven by the common synchronous clock system.

In order to enhance the noise immunity, differential clocks may be used since DDR (Dual Data Rate) DRAM (Dynamic Random Access Memory) products have been introduced for memory products. By the strict timing conditions and restrictions of the distance between devices and modules, a common signal connection fashion, which is referred to as "multi-drop" connection for all signals including differential clocks, is used while the frequency of the memory operations increases. The common source clock is used with several signal strobe attachments to the memories to ensure a large window of valid data. However, the common source clock system may not provide enough timing margin at a high frequency, for example, over 200 MHz frequency range, if there are many multi-drop based clock connections among memory devices. In order to solve the problems with the common synchronous clock structure that has many skew factors, relatively, another clock structure may be necessary.

Instead of the common synchronous clocking system, the source synchronous clocking system had been introduced to try to resolve the problem of the common synchronous clocking system that has relatively many skew factors. Enough of a timing margin may be provided when data is captured using the source synchronous clocking system. In the source synchronous clocking system, the clock is reshaped with a PLL (Phase-Locked Loop) or a DLL (Delay-Locked Loop) in the first device (memory, random logic) and then it is transmitted to the next device (memory, random logic).

Figure 3:
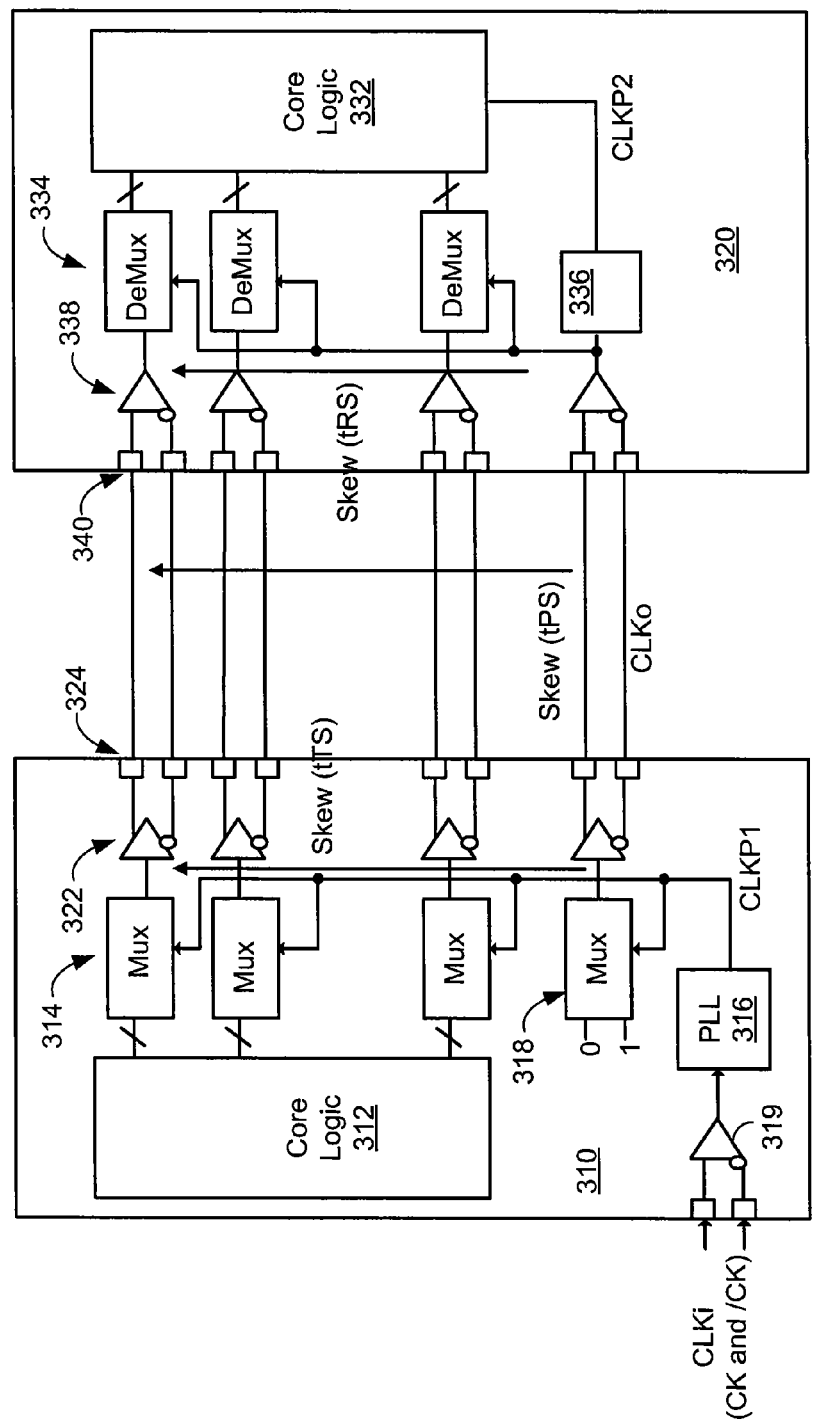
FIG. 3 is a block diagram of two memory devices connected in-series, with source synchronous clocking system with PLL.

FIG. 3 shows a source synchronous clock structure with PLL. The illustrated example includes two devices that are interconnected. One of them functions as a transmitter and the other functions as a receiver. In the illustrated example, the devices have the same structure. One of the devices shows its output interface circuitry in detail and the other shows its input interface circuitry in detail. Referring to FIG. 3, one device 310 (a transmitter) has core logic circuitry 312, a plurality of multiplexers (Muxs) 314, a PLL 316, a clock multiplexer 318, an input buffer 319 and a plurality of output buffers 322. The device 310 has a plurality of pairs of pins 324.

The other device 320 (a receiver) includes core logic circuitry 332, a plurality of demultiplexers (DeMuxs) 334, clock buffer 336, a plurality of input buffers 338, and a plurality of pairs of pins 340.

In the illustrated example, each of the core logic circuitry 312 and 332 includes control/processing unit and data store elements (not shown) for device operations.

A differential clock CLKi (which comprises a clock signal CK and a complementary clock signal /CK) is input through the input buffer 319 to the PLL 316 of the device 310. The PLL 316 in turn provides a reshaped and regenerated output clock CLKP1 to the multiplexers 314 to synchronize the operations of the multiplexers 314. The regenerated clock CLKP1 is also fed to the clock multiplexer 318 that processes the clock. A processed clock (differential clocks) is provided to match the delay between data and clock paths through one output buffer 322. The processed clock is provided as an output clock signal CLKo from the pins 324 to the other device 320.

The device 320 receives the clock CLKo and provides it to the demultiplexers 334 to synchronize the operations of the demultiplexers 334. Also, the received clock is provided to the clock buffer 336 that provides the core logic circuitry 332 with a buffered clock signal CLKP2.

Similar to the common synchronous clock structure, the source synchronous clock structure with PLL has skew factors. However, it does not have the clock insertion delay issue (tBUFF skew) and fly time skew (tFL) between two devices 310 and 320 because of the 90° phase shift by the PLL and control between clock and synchronized output data from the transmitter (the device 310). As well, the clock itself is regenerated with same frequency from PLL 316 in the transmitter side (the device 310) and it is used in the receiver side (the device 320). By this clock generation from the transmitter side and center-aligned clock with output data (90° shift from original clock), the receiver (the device 320) easily captures input data at the input buffer stage without the delay issue from the clock.

For this clocking scheme, a new skew factor occurs due to: the clock and data transfer medium difference (for example, line width and distance, even though attempts are made to match them in the manufacturing stage); instant performance change of output drivers between clock and data caused by power variation supplied to the devices, along with transistor performance discrepancy between clock and data driver such as tTS, tRS, and tPS.

The source synchronous clock structure provides higher frequency operating range than that of the common synchronous clock structure, for example, over 800 MHz, if PLL jitter and phase errors are well controlled. For these reasons, the source synchronous clock structure is to be adopted in a system having series-connected memories in order to provide higher data read and write range and bandwidth.

The above described clocking system may permit a higher frequency operating range than the operating range of the common synchronous clocking system if, for example, the system is well designed, and PLL jitter and phase error are well controlled.

Figure 4:
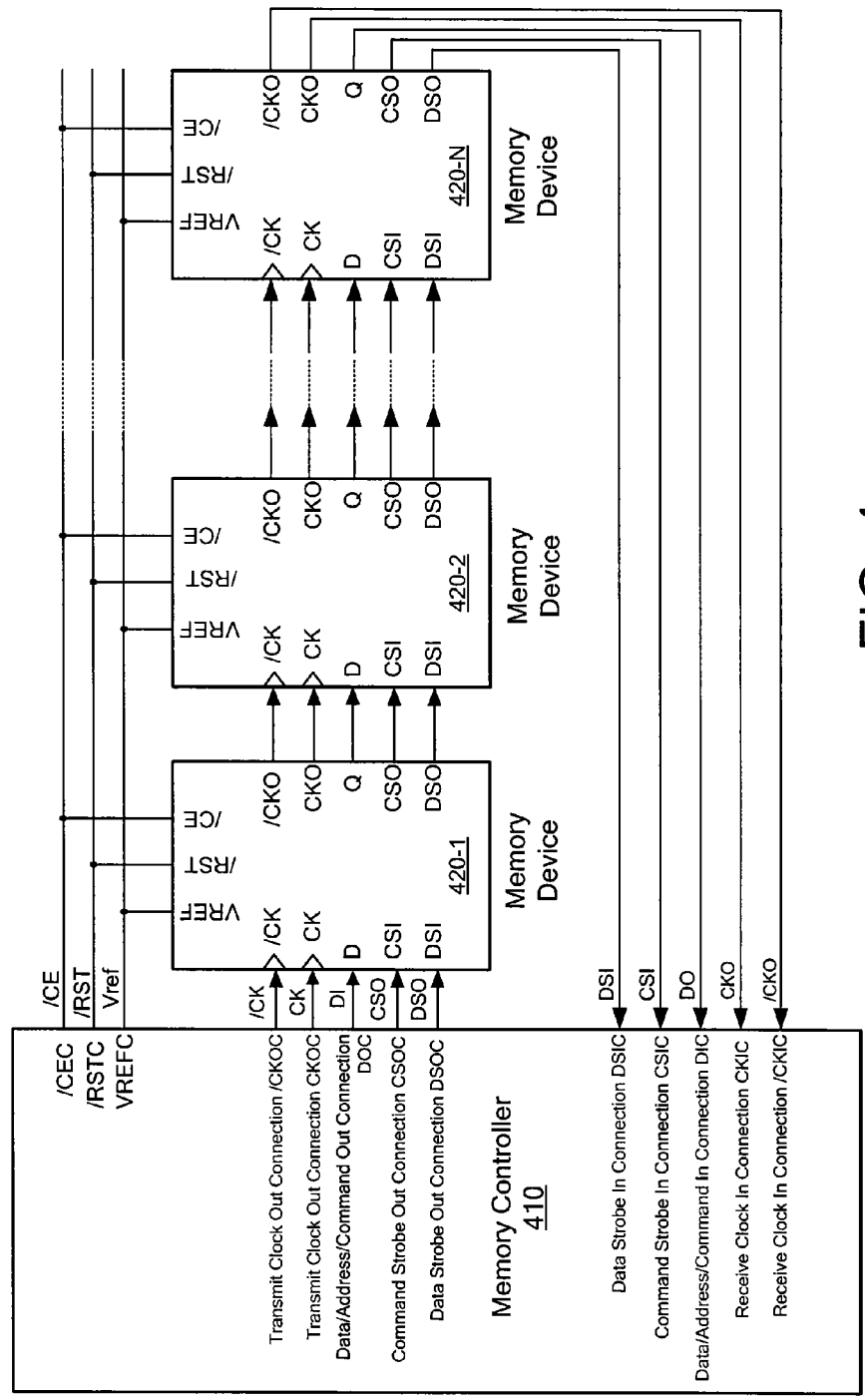
FIG. 4 shows an example of a system having a controller and a plurality of devices connected in-series with a source synchronous clocking method.

FIG. 4 shows an example of a system having a memory controller 410 and a plurality of devices that are series-connected, with a source synchronous clocking method as described in more detail in U.S. Provisional Patent Application No. 60/902,003 entitled "Non-Volatile Memory System" filed Feb. 16, 2007, the entire contents of which are herein incorporated by reference. The system includes a plurality (N) of devices 420-1, 420-2, - - - , 420-N connected in-series, N being an integer greater than one.

The memory controller 410 has data out connection DOC [0:7] for data/address/command, a command strobe output connection CSOC, a data strobe output connection DSOC, a chip enable output connection /CEC, a reference voltage connection VREFC and a reset output connection /RSTC. Also, the memory controller 410 has a pair of clock output connections CKOC and /CKOC. Each of the devices has a data input D, a command strobe input CSI, a data strobe input DSI, a reset input /RST, a chip enable input /CE and a pair of clock inputs CK and /CK. Also, each of the devices has a data output Q, a command strobe output CSO, a data strobe output DSO. The data output Q, the command strobe output CSO and the data strobe output DSO of one device are coupled to the data input D, the command strobe input CSI and the data strobe input DSI of the next device, respectively. The devices 420-1-420-N receive a chip enable signal '/CE', a reset signal '/RST' and a reference voltage 'Vref' from the memory controller 410 in a parallel fashion. The data may be provided and transmitted as serial data or parallel data.

The data output DOC[0:7] of the memory controller 410 provides input data DI1[0:7] to the data input D of the first device 420-1. The first device 420-1 provides output data DO1[0:7] to the second device 420-2. The second device 420-2 receives the output data DO1[0:7] as its input data DI2[0:7] transmitted from the first device 420-1. Each of the other devices performs the same functions.

The command strobe input CSI and data strobe input DSI of one device receive the CSI signal and the DSI signal, respectively. Also, the command strobe output CSO and the data strobe output DSO of one device transmit the CSO signal and the DSO signal, respectively, to the next device. The data transfer is controlled by the command strobe input and data strobe input signals in each device. Each of the devices provides delayed versions of the CSI signal and the DSI signal, the CSO signal and the DSO signal to a next device. The transfers of the data and CSI, DSI are performed in response to the clock signals CK and /CK.

Example details of an architecture featuring devices that are series-connected are provided in U.S. Patent Application Publication No. 2007/0076502 A1 (Apr. 5, 2007); and International Publication No. WO/2007/036048 (5 Apr. 2007), the disclosures of which are hereby incorporated by reference in their entirety. Other example details of an architecture featuring devices that are series-connected are provided in International Publication No. WO/2008/067652 (12 Jun. 2008) and International Publication No. WO/2008/022454 (28 Feb. 2008), the disclosures of which are hereby incorporated by reference in their entirety.

The last device (the memory device 420-N) provides the output data DO[0:7], the command strobe output signal CSO, the data strobe output signal DSO and a pair of output clock signals CKO and /CKO to respective receiving connections DIC, CSIC, DSIC and CKIC and /CKIC of the memory controller 410, respectively.

Figure 5:
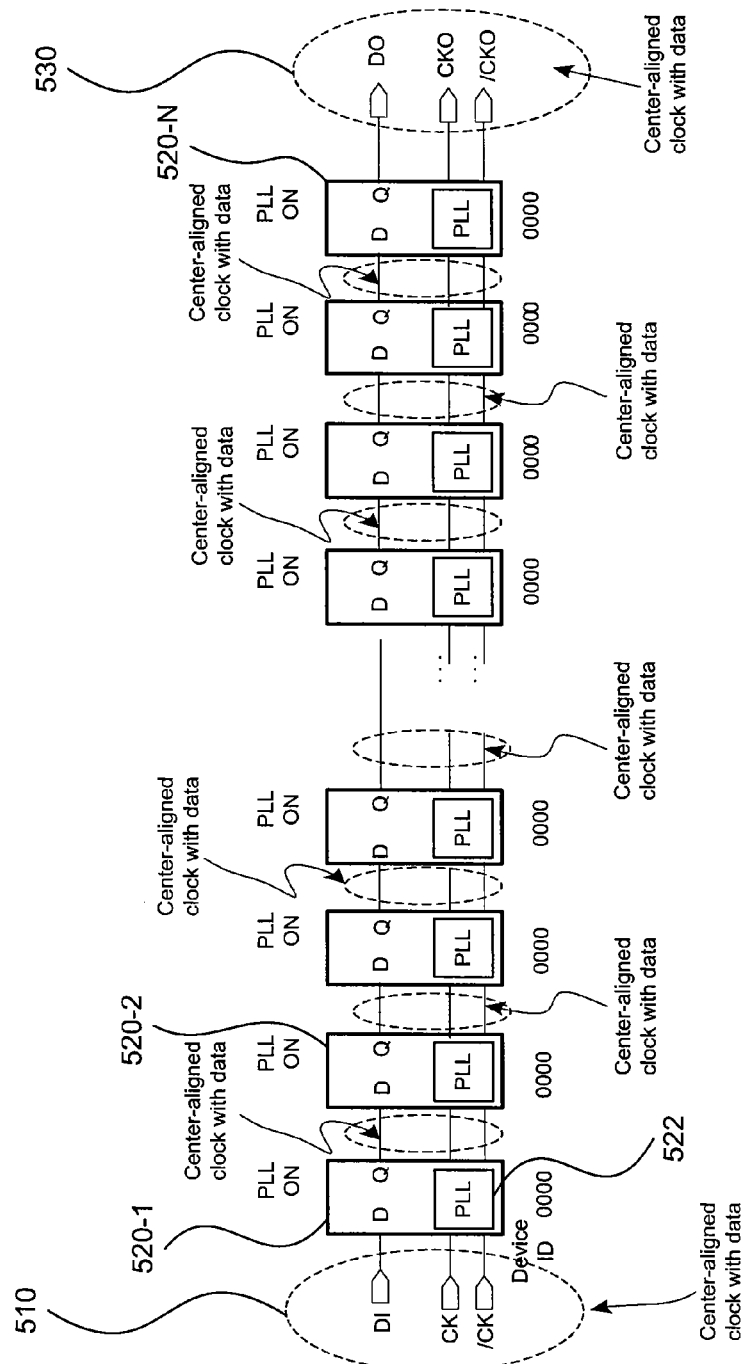
FIG. 5 shows an example of a source synchronous clocking system including a plurality of devices connected in-series, each device including a PLL.

FIG. 5 shows an example of a source synchronous clocking system including a plurality of devices connected in-series. The system includes a controller (not shown) generating controller output signals 510 and a plurality of devices 520-1, 520-2, - - - , 520-N connected in-series. In the example of FIG. 5, each of the devices 520-1, 520-2, - - - , 520-N comprises a PLL 522 as a clock reshaper. In FIG. 5, the PLLs 522 of all devices are on before device identifier (ID) assignment. The PLL 522 reshapes the clock, irrespective of the type of clock inputted, such that each device produces its own clock. The PLL 522 enables each of the devices 520-1, 520-2, - - - , 520-N to send a clearer or better clock signal to the next device. Using the produced clock signals, the output is synchronized into outgoing signals 530 and sent to the controller. All inputs and outputs are controlled by a device's internal PLL 522.

The controller output signals 510, seen as incoming signals with respect to the first device 520-1, is transmitted to the first device 520-1 of the series-connected memory devices. The differential clocks, CK and /CK, are used to make an internal reference clock to be inputted to the PLL 522. A 90° phase-shifted clock is then provided along with duty cycle correction of the phase-shifted clock. Data is then captured with the input clock which is already center-aligned from the controller so that data capture is performed in input stage without any additional data or clock reshaping by PLL. The PLL 522 is used to regenerate an internal clock so as to provide outgoing data with clock shifting of 90° from the input clock signal CK and /CK. Therefore, all devices on the source synchronous clock system generate a center-aligned clock with output data.

The PLL 522 in the first device 520-1 generates the clock and sends it to the second device 520-2. The read result of the first device 520-1 (if it was in data read operation) or the passing through of incoming data (if it was in transfer operation) is transmitted to the second device 520-2 along with the output of a 90° shifted clock. The second device 520-2 receives the input clock and also generates a new clock based on the input clock received from the first device 520-1. For example, the second device 520-2 can receive the passing through data from the first device 520-1, or the read result of the first device along with a clock that is center-aligned with incoming data. By this flow, data is passed through from the first device 520-1 to the last device 520-N to provide outgoing data 530 from the plurality of series-connected memory devices, which is seen by the controller as controller input data.

Using the reshaped clock signals, the output is synchronized and sent to the controller in the outgoing signals 530. In this case, the clock is also sent, in order to determine which point is a valid point of output. The phase of the CK and CKO signals at the input and at the output of a set of serially connected memory devices is different. The frequency is the same because even though the PLL is used, the frequency is not changed. In this example, the PLL is only used as a phase shifter. In the example of FIG. 5, the CKO and /CKO signals are sent, or returned, to the controller, along with the DO signal. In another example, the DO may be sent to another controller. Unlike parallel clocking, the output and clock signals are independent of the input end.

Without a PLL 522, the clock is provided with a simple driver, and the duty cycle can be modified or distorted at the output of a number of connected devices. In fact, with a high number of connected devices, the clock can degrade to become a steady signal. With the increasing popularity of dual data rate (DDR), duty cycles are becoming important, and can even be critical. A drawback of using a PLL is higher power consumption. Even devices with low power PLLs consume more power than those without PLLs. However, PLLs are needed to ensure high frequency operation.

For example, PLLs can contribute about 10% of a memory device's total power consumption. Suppose the device uses 25 mW, the PLL accounts for 2.5 mW. In a system with 10 devices, the total power consumption due to PLLs is the same as the power consumption of an entire device. Therefore, embodiments of the present invention enable the use of a larger number of devices within the same power consumption threshold.

Embodiments of the present invention include a memory controller that can be implemented in the context of a source synchronous clocking method in a system such as in FIG. 4 or FIG. 5. In some embodiments of such a system, only PLLs of every second device are turned on during operation, after an initial setup and configuration phase.

According to an embodiment of the present invention, maximum 50% of the PLLs are operating, and power can be saved while ensuring high frequency operation. For example, in a system with 3 in-series devices, an embodiment in which one device is off and 2 devices are on saves some power. In another embodiment, having 2 devices off and 1 device on saves more power in a similar arrangement with PLLs in alternate devices turned off. In many other cases, about 50% of the devices are turned off when each alternating device is turned off.

Before turning alternate PLLs on and off, every PLL needs to be turned on, as shown in FIG. 5, which illustrates device PLLs during a configuration phase that precedes operational implementation. This is the state before ID assignment, since at this point it is unknown which devices are odd numbered devices, and which are even numbered devices. All device IDs are initially set to 0000. Therefore, in the pre-ID assignment state, all devices have an ID of 0000 and every device's PLL is turned on, as illustrated in FIG. 5.

Examples of ID assignment in series-connected devices are disclosed in International Publication Nos. WO/2007/109886 (4 Oct. 2007), WO/2007/134444 (29 Nov. 2007) and WO/2008/074126 (26 Jun. 2008), the contents of which are incorporated herein by reference in their entirety.

During ID generation, even though each memory device has a unique ID number, it does not affect the clock shape that is center-aligned clock until the last device sends its ID to the controller. So, some fixed time latency is considered in each memory device and controller in order to avoid malfunction of clock and data operations. Therefore, there is no clock reshaping during ID assignment. All PLLs are enabled even after ID is assigned to each memory device. After getting the final ID number from the last device, the controller starts reshaping the clock, if the controller should change its clock. Between ID assignment and clock reshaping, there is enough time to prevent malfunction. By this additional wait time, there is no malfunction caused by sudden change of relationship between clock and data.

While all of the devices have a PLL turned on during the initial setup phase, such as shown in FIG. 5, the time taken for that setup is small compared to the overall operating time for the devices. In one example, less than 1-5% of overall time is spent in the setup phase. Only in cases where power is frequently turned on and off, will the setup phase power consumption even be a small consideration.

Figure 6A:
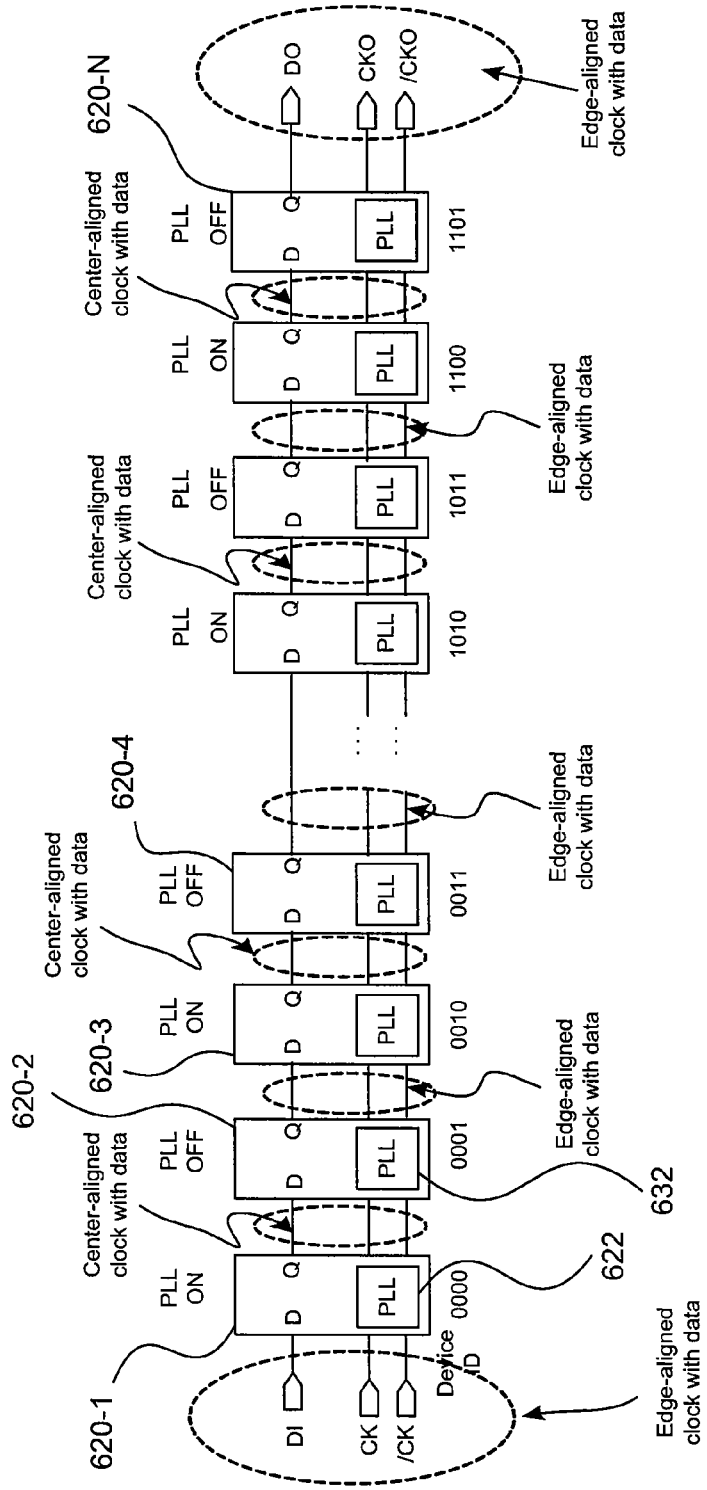
FIG. 6A shows an example of a full source synchronous clocking method in series-connected devices having an alternate PLL on-control.
Figure 6B:
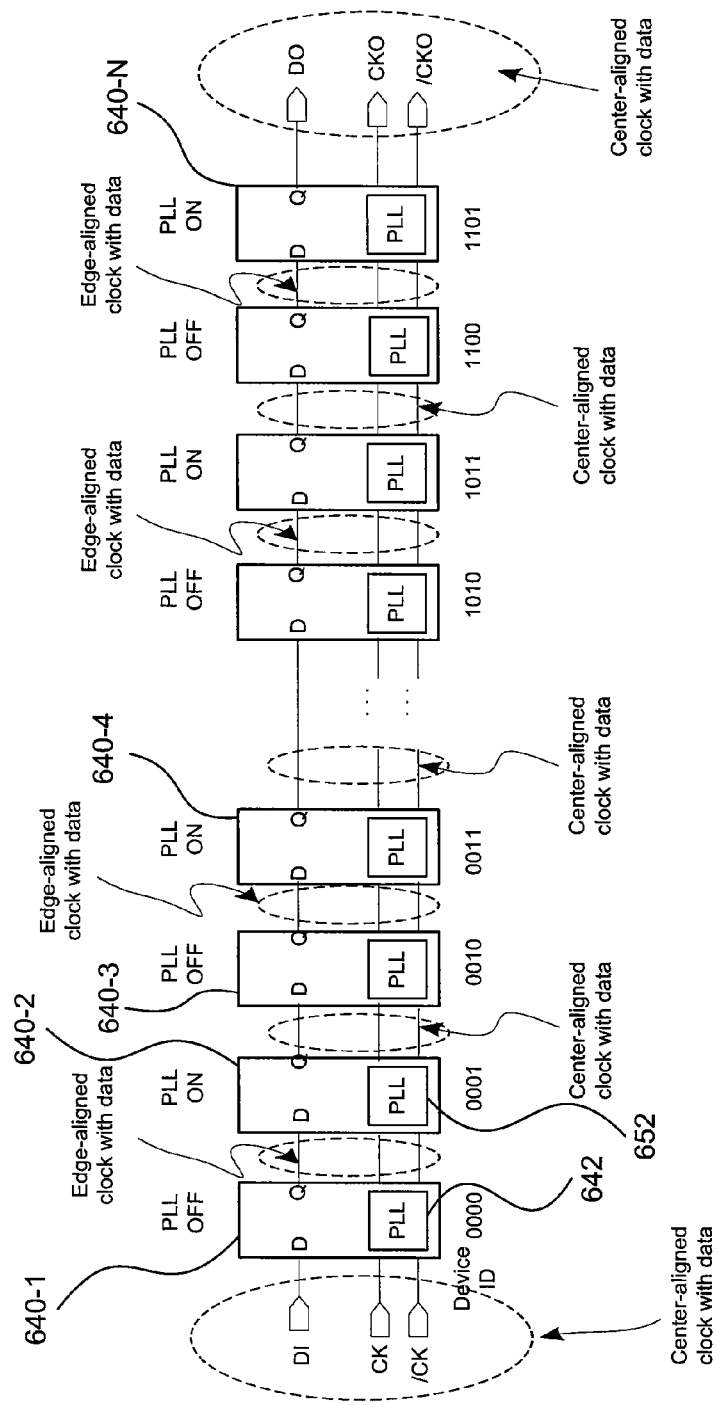
FIG. 6B shows another example of a full source synchronous clocking method in series-connected devices having an alternate PLL on-control.

FIGS. 6A and 6B show an alternate PLL on-control in two different operational implementations. In accordance with some examples of alternate PLL on-control, about 50% of PLL power consumption can be reduced after power-up operation (power-up operation includes, for example, ID generation or assignment of the series-connected memory devices).

A different clock will be transmitted for the first case (FIG. 6A) and for the second case (FIG. 6B). FIG. 6A depicts that the PLL of a device is on when a least significant bit (LSB) of an ID assigned to the device is "0" and FIG. 6B depicts that a PLL is on when the LSB of the assigned ID is "1". In FIG. 6A, a plurality of devices 620-1, 620-2, 620-3, 620-4, - - -, 620-N are connected in-series. The odd numbered devices 620-1, 620-3, - - - have their PLLs 622 turned on, while even numbered devices 620-2, 620-4, - - - have their PLLs 632 turned off. With a PLL 622 of the device with an even ID number ("0000", "0010", - - - ) turned on, a center-aligned clock with data will be sent to the next device. With a PLL 632 of the device with an odd ID number ("0001", "0011", - - - ) turned off, an edge-aligned clock with data will be sent to the next device. In the particular example, the device ID assigned to each device is a binary code.

In FIG. 6B, odd numbered devices 640-1, 640-3, - - - have their PLLs 642 turned off, while even numbered devices 640-2, 640-4, - - - have their PLLs 652 turned on. In that case, with a PLL 642 of the device with an even ID number ("0000", "0010", - - - ) turned off, an edge-aligned clock with data will be sent to the next device. Also, with a PLL 652 of the device with an odd ID number ("0001", "0011", - - - ) turned on, a center-aligned clock with data will be sent to the next device.

According to the alternate PLL control approach, the memory controller will expect a different clock and data timing relationship based on a detection that will occur before the start of any normal operation.

Figure 7A:
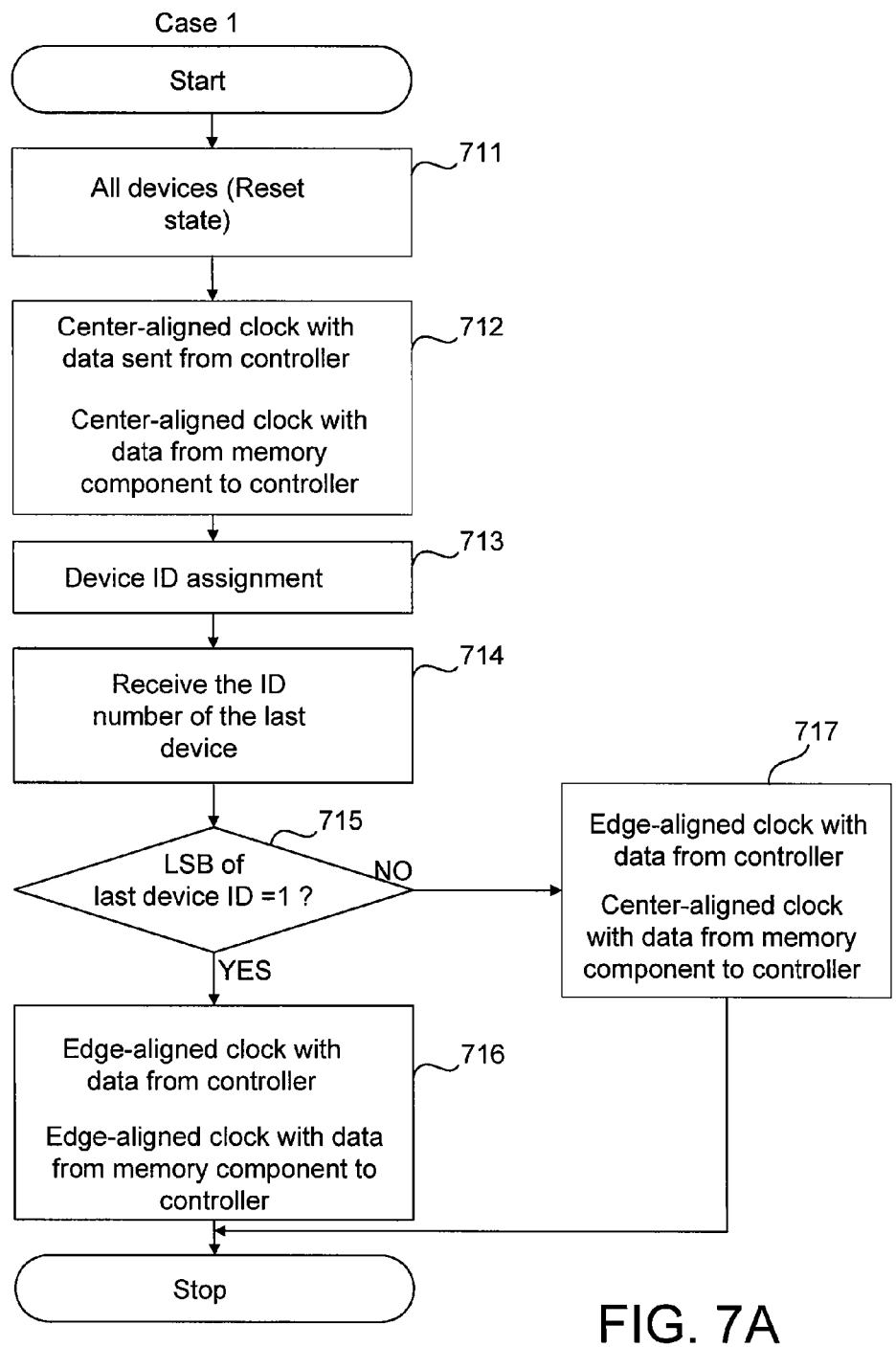
FIG. 7A shows a flowchart of an example of clock alignment determination with ID number of the last device in the series-connected devices.

FIG. 7A shows a flowchart of an example of clock alignment determination with ID number of the last device in the series-connected devices, such as for Case 1 or the first case as described in relation to FIG. 6A. In step 711, the state of all devices is reset. The PLLs of all devices are on as shown in FIG. 5. In step 712, a center-aligned clock with data is sent from the memory controller and a center-aligned clock with data is received at the memory controller, such as from the last memory component (the last device 620-N). In step 713, each device in the series-connected devices 620-1 to 620-N is assigned a unique identifier, or ID. For example, the device IDs can be sequentially assigned. In step 714, the memory controller receives the ID number assigned to the last device 620-N. In step 715, the memory controller determines whether the least significant bit (LSB) of the ID number of the last device is "1".

As shown in step 716 in FIG. 7A, if the LSB of the last device's ID is "1" (e.g., "1101": YES at step 715), the edge-aligned clock with data is provided from the memory controller, and the edge-aligned clock with data is provided from the last device 620-N to the memory controller. In step 717, if the LSB is "0" (e.g., "1100": NO at step 715), the edge-aligned clock with data is provided from the memory controller to the first device 620-1 and the centre-aligned clock with data is provided from the memory device (e.g., the device to which the ID "1100" was assigned) to the memory controller.

Figure 7B:
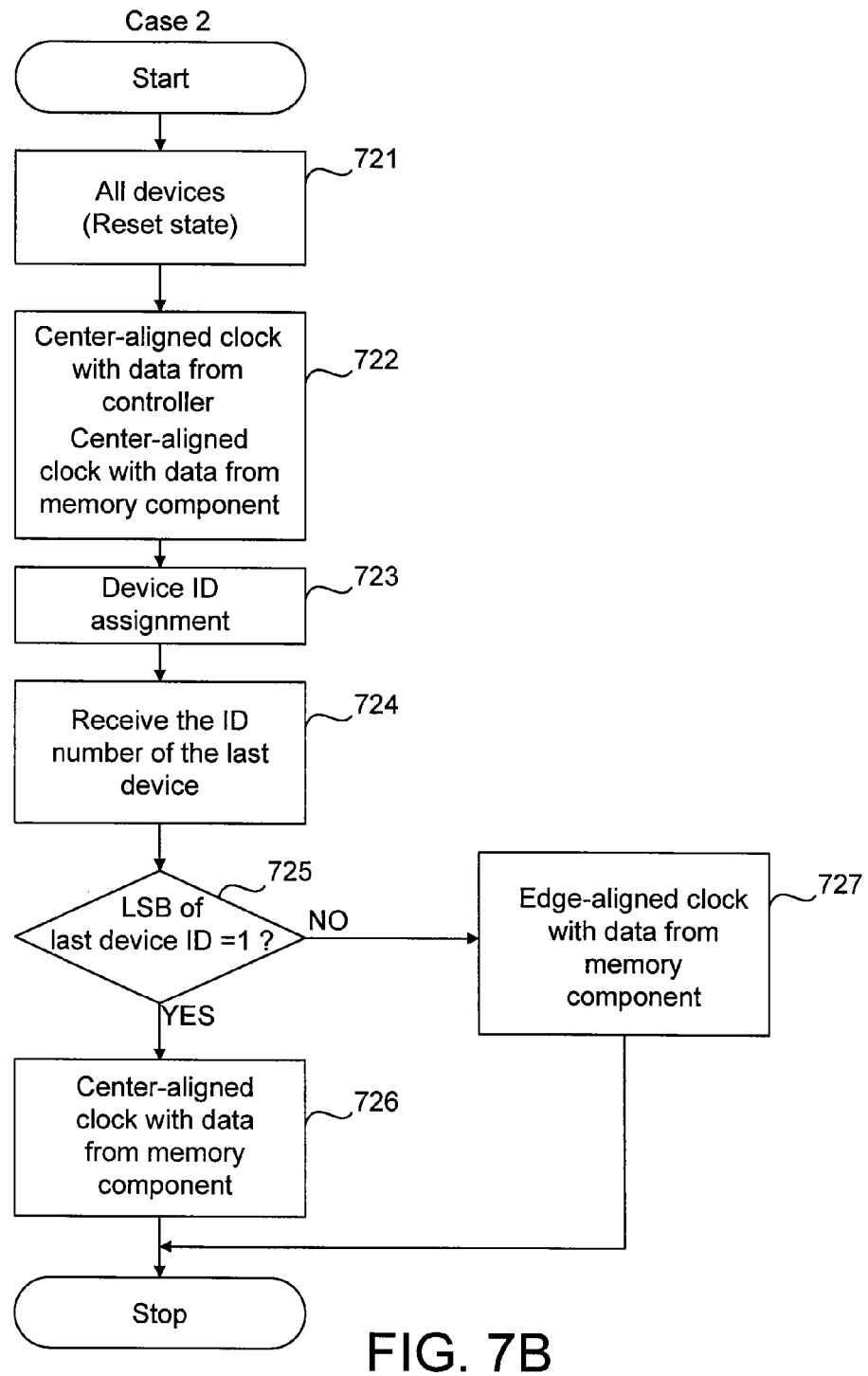
FIG. 7B shows a flowchart of another example of clock alignment determination with ID number of the last device in the series-connected devices.

FIG. 7B shows a flowchart of another example of clock alignment determination with ID number of the last device in the series-connected devices, such as for Case 2 or the second case as described in relation to FIG. 6B. In step 721, the state of all devices is reset. The PLLs of all devices are on as shown in FIG. 5. In step 722, center-aligned clock with data is provided from the controller to the first device 640-1 and center-aligned clock with data is received at the controller, such as from a memory component (the last device 640-N). In step 723, each device in the series-connected devices is assigned a unique identifier, or ID. In step 724, the memory controller receives the ID number assigned to the last device 640-N. In step 725, the memory controller determines whether the LSB of the received ID number is "1". As shown in step 726, if the LSB of the last device is "1" (e.g., "1101": YES at step 725), the center-aligned clock with data is provided from the last device 640-N to the memory controller. If the LSB of the received ID is "0" (e.g., "1100": NO at step 725), as shown in step 727, the edge-aligned clock with data is provided from the memory component (e.g., the device of ID "1100") to the memory controller.

In the method of FIG. 7B, particularly in steps 726 and 727, the use of a center-aligned clock in the memory controller is implicit. When the ID numbers are reset, the center-aligned clock is used in the controller. This clock is not changed once the ID numbers are assigned to the memory devices.

The flowchart of FIG. 7A is for Case 1, in which devices with an even number LSB (LSB=0) have their PLL on. The flowchart for FIG. 7B is for Case 2, in which for each device where the LSB=1, PLL=on. In each case, the number of connected devices is considered. Depending on the number of devices, and the case, the edge-aligned or center-aligned clock is selected. The steps in the method consider only the LSB of the ID number assigned to the last device of the series-connected devices. There are four different cases, and the controller has different clock control for each case. There are only two different operations or output cases for the four input cases: edge align or center align.

Presently preferred embodiments include a single alternating on/off pattern for PLLs (i.e. one on, one off, one on, one off, etc.) in a plurality of in-series memory devices. In other embodiments, other patterns can be implemented, but may not be able to provide high frequency operation. Each device can recognize based on the ID assignment state, a received ID assignment command, and an LSB of the device's ID number, whether its PLL is to be turned on or off.

Depending on the number of devices, the clock alignment is different. In the case where the PLLs of even numbered LSBs are turned on, and the series of devices includes an even number of devices, the last device has an edge-aligned clock. For an odd number of devices, the last device has a center-aligned clock. In the case where the PLLs of odd numbered LSBs are turned on, and the series of devices includes an even number of devices, the last device has an center-aligned clock. For an odd number of devices, the last device has an edge-aligned clock. Therefore, the last clock alignment can be changed based on the circumstance.

Figure 8:
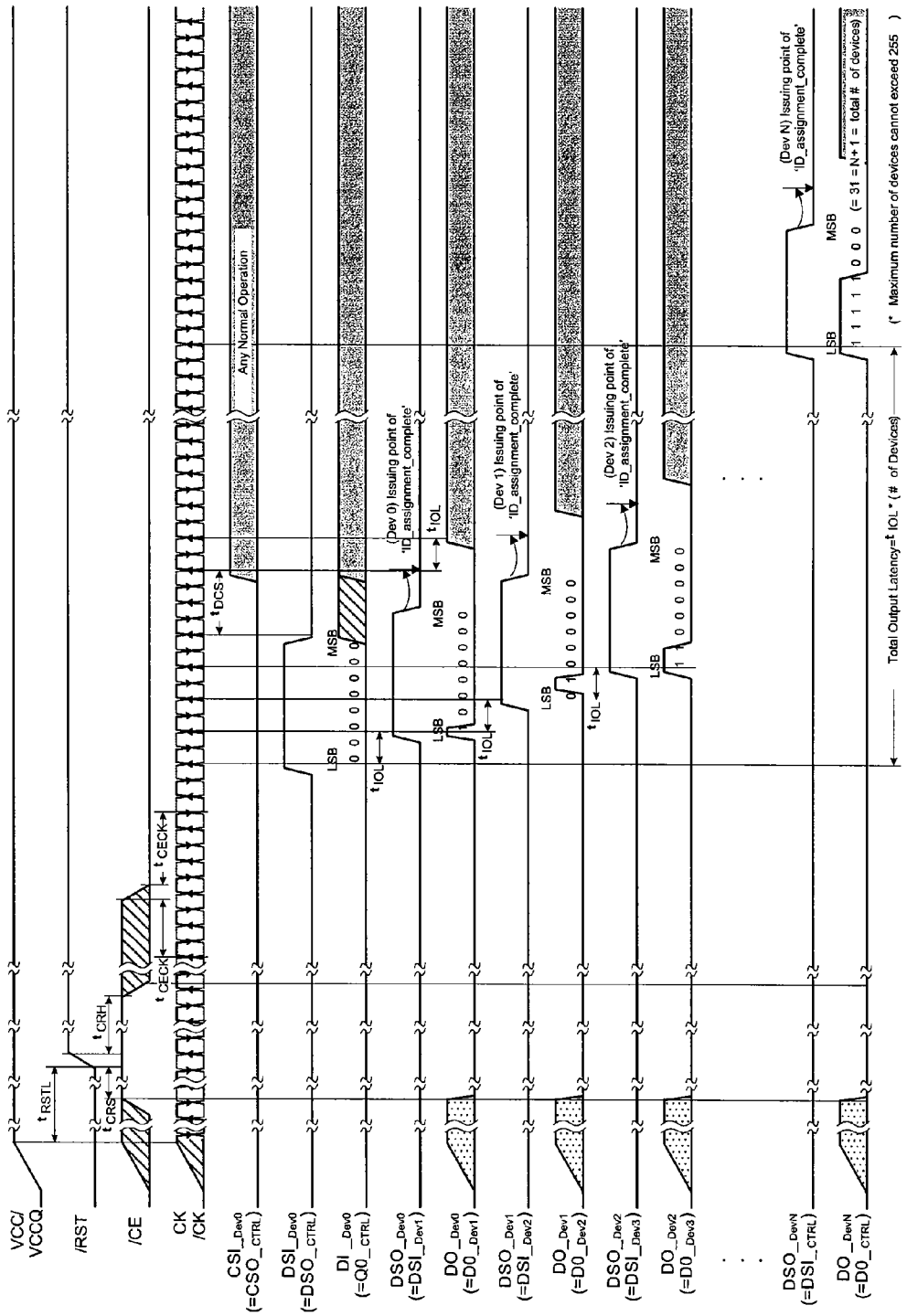
FIG. 8 shows an ID generation timing in an example power-up sequence.

FIG. 8 shows ID generation timing in an example power-up sequence. The timing diagram illustrates the relative states of a number of signals in relation to each other during a power-up sequence, including: VCC/VCCQ, /RST, /CE, Ck, /CK, CSI, DSI and DI. Also shown are a number of sets of signals DSO, DO. In the particular example shown in FIG. 8, N is the device address (N=30 in this example); 'Dev' represents a device number; and 'CTRL' represents a controller.

A memory controller according to an embodiment of the present invention has features to determine which clock alignment should be assigned. This is based on which arrangement (Case 1 or Case 2) of alternate PLLs are turned on (odd ones or even ones), and based on the total number of serially connected devices. Embodiments of the present invention control whether the center-aligned or edge-aligned signals are sent, and do so in an automatic way.

A memory controller according to an embodiment of the present invention can determine what type of clock to transmit to the memory and to be received from the memory, depending on the logic configuration of series-connected memory devices. Embodiments of the present invention can be used in conjunction with a fully source synchronous clocking approach, with alternating PLL control. Some PLLs are on or off, depending on their location or ID assignment. A new type of clock controller according to an embodiment of the present invention is needed for this approach.

Figure 9A:
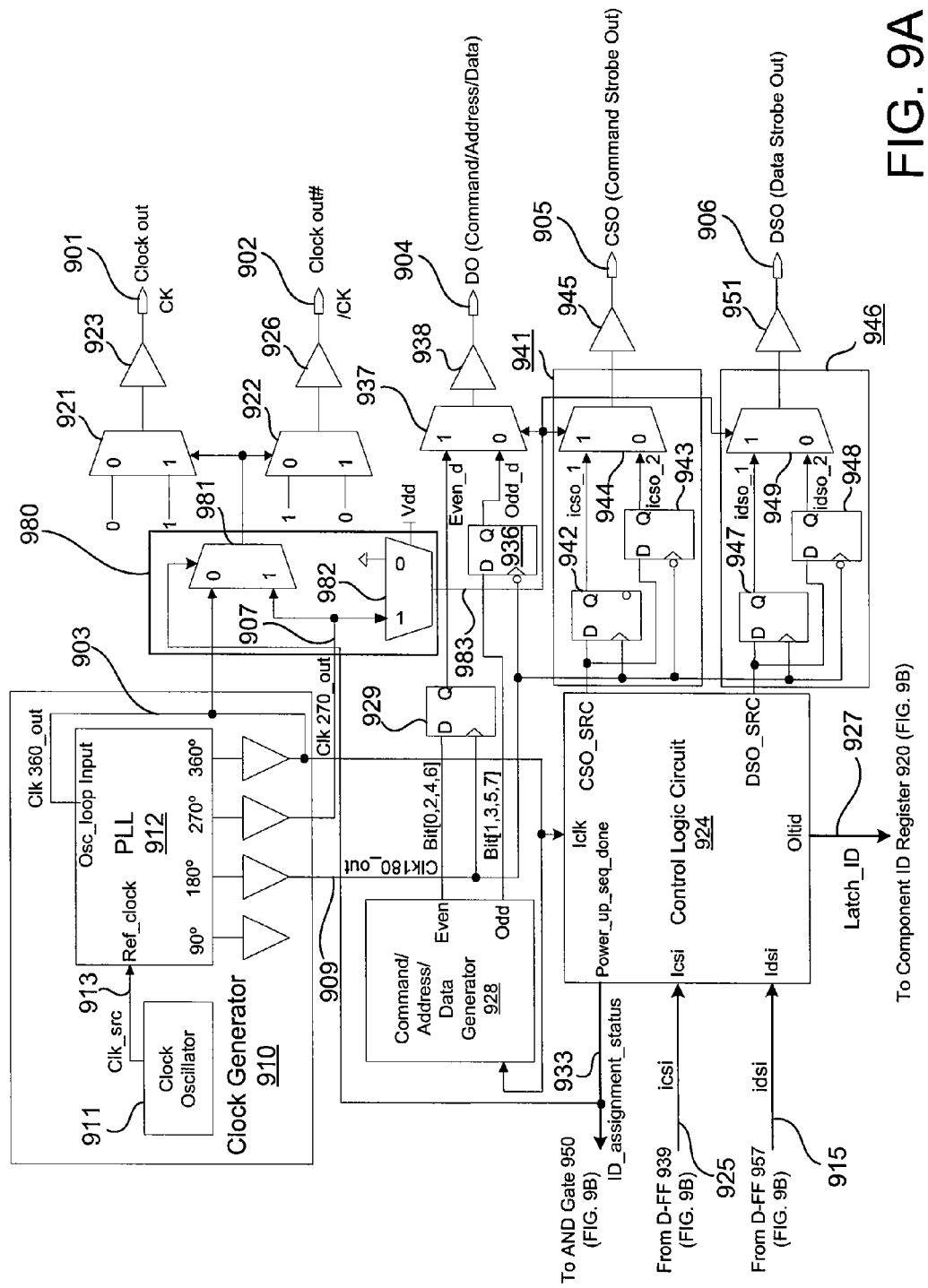
FIGS. 9A and 9B show an example memory controller logic configuration according to an embodiment of the present invention to support flexible data alignment.
Figure 9B:
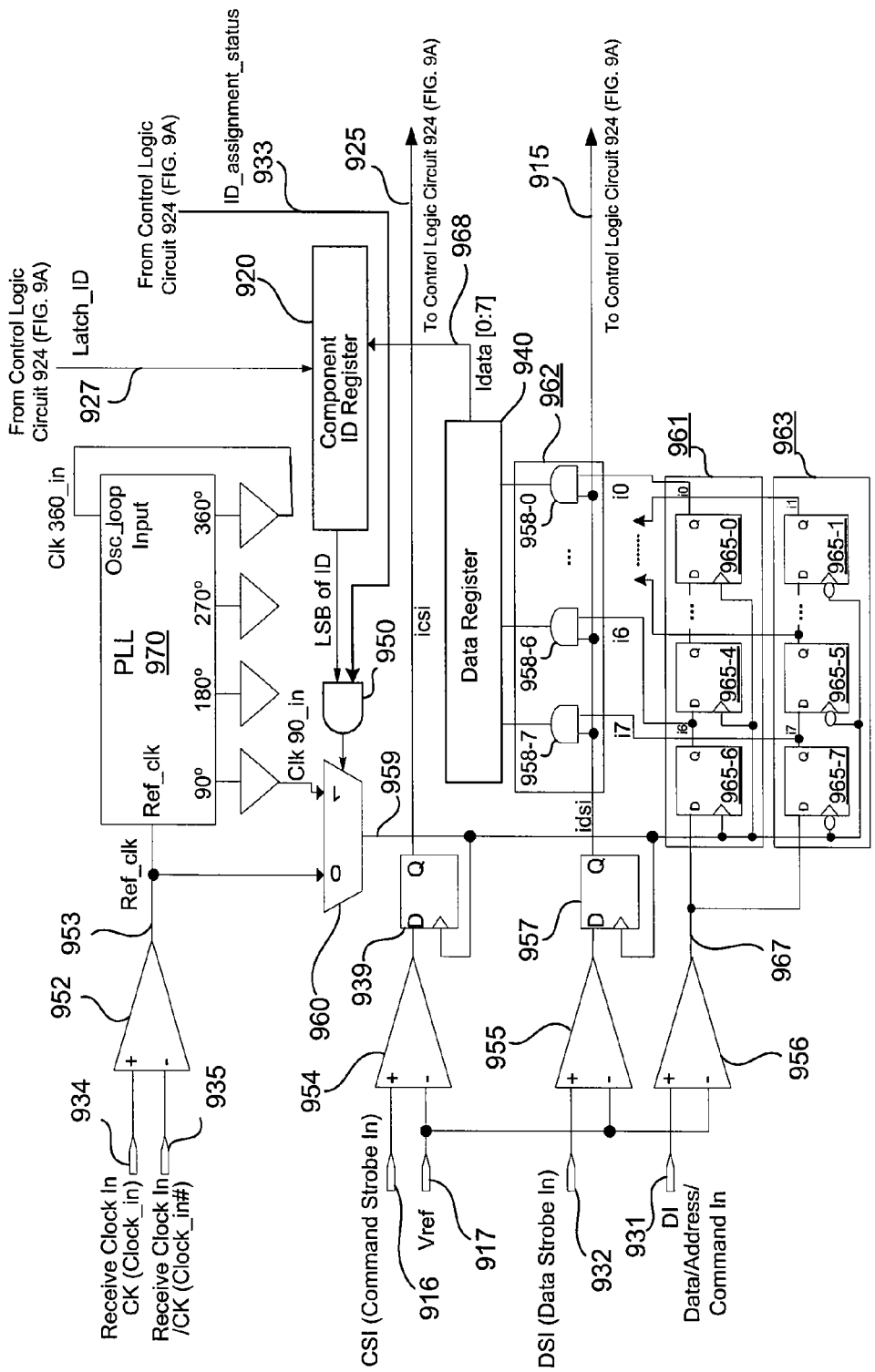

FIGS. 9A and 9B show a circuit schematic of one example of a memory controller with flexible data alignment to clock for a first case, previously described as Case 1 in relation to FIGS. 6A and 7A. This logic combination is just one example so that those skilled in the art can make different types of circuit configurations with ease. For Case 1, the controller should generate an edge-aligned clock with data.

Referring to FIGS. 9A and 9B, to provide center-aligned clock with data from memory controller, Clock_out 901 and /Clock_out 902 are synchronized with Clk360_out 903. The DO (command/address/data) 904, CSO 905 and DSO 906 signals are synchronized with Clk270_out 907. A clock generator 910 having a clock oscillator 911, a PLL 912 and a plurality of output buffers produces clock signals. An internally generated clock signal 'Clk_src' 913 is provided by the clock oscillator 911 to a reference clock input 'Ref_clock' of the PLL 912 which in turn produces a plurality of phase-shifted clock signals by 90°, 180°, 270° and 360°. The 180°, 270° and 360° phase-shifted clock signals are provided through respective output buffers as Clk180_out 909, Clk270_out 907 and Clk360_out 903. The Clk180_out 909, Clk270_out 907 and Clk360_out 903 are synchronized with the internally generated clock signal 913. The Clk360_out 903 and Clk270_out 907 are provided to a mode detection logic circuit 980 including two selectors 981 and 982, each has "0" and "1" inputs and a selection input. The "0" and "1" inputs of the selector 981 receive Clk360_out 903 and Clk270_out 907, respectively. The "1" input of the selector 982 receives Clk270_out 907 and the "0" input of the selector 982 is pulled down. The selection input of the selector 982 is pulled up and thus, the "1" input thereof is always selected to output Clk270_out as a selected 270 clock signal 983.

A control logic circuit 924 has various input and output connections. An internal command strobe in input Icsi of the control logic circuit 924 receives an internal command strobe in signal 'icsi' 925 from a D-type flip-flop (D-FF) 939. Similarly, an internal data strobe in input Idsi receives an internal data strobe in signal 'idsi' 915 from a D-FF 957. A clock input Iclk receives the Clk360_out 903. The control logic circuit 924 provides an 'ID_assignment_status' signal 933 from its 'Power up_seq_done' output and a latch ID signal 'Latch_ID' 927 from its Oltid output. The "ID_assignment_status' signal 933 represents the status whether the ID assignment is completed or in progress. The ID assignment status is in the power-up sequence.

The 'ID_assignment_status' signal 933 is fed to the selection input of the selector 981. A selected output signal from the selector 981 is provided to selection inputs of selectors 921 and 922, each has "0" and "1" inputs and a selection input. The "0" and "1" inputs of the selector 921 are provided with logic "0" and "1" signals, respectively. The "0" and "1" inputs of the selector 922 are provided with logic "1" and "0" signals, respectively. The selection inputs of the selectors 921 and 922 receive the selected output signal from the selector 981. Selected output signals of the selectors 921 and 922 are provided through respective output buffers 923 and 926 as Clock_out 901 and /Clock_out 902.

The Clk360_out 903 is also provided to a command/address/data generator 928 which in turn provides eight-bit data of bits 0-7. The four bits of even bits [0,2,4,6] and four bits of odd bits [1,3,5,7] are provided to data D inputs of FF 929 and 936, respectively. The Clk180_out 909 is provided to clock input of the D-FF 929 and inverting clock input of the D-FF 936. The even bits [0,2,4,6] and the odd bits [1,3,5,7] are latched in the D-FFs 929 and 936, respectively. The D-FFs 929 and 936 provide even data bits 'Even_d' and odd data bits 'Odd_d' to "1" and "0" inputs of a selector 937, respectively. The 'Odd_d' is 180° phase-shifted from the 'Even_d'. In response to the selected 270 clock signal 983, the selector 937 selects the even or odd data bits. The selected data bits are provided as DO (command/address/data) 904 through an output buffer 938.

The control logic circuit 924 provides command strobe out and data strobe out signals from its outputs CSO_SRC and DSO_SRC, respectively, which are connected to a command strobe output circuit 941 and a data strobe output circuit 946. The internally produced command strobe out signal in response to the Clk360_out 903 is fed to D inputs of two D-FFs 942 and 943 of the command strobe output circuit 941. The Clk180_out 909 is provided to clock input of the D-FF 942 and inverting clock input of the D-FF 943. Output signals of the D-FFs 942 and 943 are provided as 'icso_1' and 'icso_2' signals to "1" and "0" inputs of a selector 944, respectively. The 'icso_2' signal is 180° phase-shifted form the 'icso_1' signal. In response to the selected 270 clock signal 983, the selector 944 selects one of the 'icso_1' and 'icso_2' signals and the selected signal is provided through an output buffer 945 as the CSO 905.

The data strobe output circuit 946 has the same structure as the command strobe output circuit 941 including two D-FFs and one selector. The internally produced data strobe out signal in response to the Clk360_out 903 is provided from the control logic circuit 924 to the D inputs of two D-FFs 947 and 948 of the data strobe output circuit 946. The Clk180_out 909 is provided to clock input of D-FF 947 and inverting clock input of D-FF 948. Output signals 'idso_1' and 'idso_2' from the D-FFs 947 and 948 are fed to "1" and "0" inputs of a selector 949, respectively. The 'idso_2' signal is 180° phase-shifted form the 'idso_1' signal. In response to the selected 270 clock signal 983, the selector 949 selects one of the 'idso_1' and 'idso_2' signals and the selected signal is provided through an output buffer 951 as the DSO (data strobe out) 906.

The last (N-th) device 420-N (see FIG. 4) sends the CKO and /CKO signals to the memory controller 410. The CKO and /CKO signals are provided as Clock_in 934 and Clock_in# 935 to "+" and "−" inputs of a differential input buffer 952 which in turn provides a reference cock signal Ref_clk 953. The reference clock signal 953 is fed to the reference clock input 'Ref-clk' of a PLL 970 and a "0" input of a selector 960. The PLL 970 outputs four phase-shifted clocks signals of 90°, 180°, 270° and 360° with the reference clock signal 953. The 90° phase-shifted clock signal is provided as 'Clk90_in' through an output buffer to a "1" input of the selector 960. The 360° phase-shifted clock signal is provided as 'Clk360_in' through an output buffer to an 'Osc_loop Input' of the PLL 970. The 'Latch_ID' signal 927 is provided to a component ID register 920 that receives an internal data signal 968 of eight-bit 'Idata [0:7]' from a data register 940. The component ID register 920 stores the input data in response to the "Latch_ID' signal 927. The component ID register 920 outputs the least significant bit (LSB) of the ID registered thereby to an AND gate 950 that receives the 'ID_assignment_status' signal 933. The AND gate 950 provides a logic output signal to the selection input of the selector 960 to select the reference clock signal 953 or the 90° phase-shifted clock signal 'Clk90_in'. A selected clock signal 959 from the selector 960 is provided to clock inputs of D-FFs 939 and 957.

The last (N-th) device 420-N (see FIG. 4) sends the D signal 931, DSI signal 932 and CSI signal 916 to the memory controller 410. The D signal 931, DSI signal 932 and CSI signal 916 to the memory controller 410. The reference voltage 'Vref' 917 is internally generated in the memory controller 410 itself or externally generated from a power generator (not shown). The reference voltage Vref is provided to a "−" input of a differential input buffer 954, the "+" input of which receives the CSI 916. The input buffer 954 outputs a differential buffer output signal to the D input of the D-FF 939 which outputs the 'icsi' signal 925 to the control logic circuit 924 in response to the selected clock signal 959.

The DSI signal 932 and the reference voltage signal Vref are provided to "+" and "−" inputs of a differential input buffer 955, the differential input buffer output signal of which is fed to the D input of the D-FF 957. The data signal 'D' 931 and the reference voltage Vref are provided to "+" and "−" inputs of a differential input buffer 956, the differential input buffer output signal 967 of which is fed to inputs of latch circuits 961 and 963. The circuit 961 includes four D-FFs 965-6, 965-4, - - - , 965-0 that are series-connected. Similarly, the circuit 963 includes four D-FFs 965-7, 965-5, - - - , 965-1 that are series-connected.

The output signal of the D-FF 957 is provided as the internal data strobe in signal 'idsi' 915. The 'idsi' signal 915 is provided to the control logic circuit 924 and to a data strobe in circuit 962 having eight AND gates 958-7, 958-6, - - - , 958-0. The selected clock signal 959 from the selector 960 is provided to the clock inputs of the D-FFs 965-6, 965-4, - - - , 965-0 and the inverted clock inputs of the D-FFs 965-7, 965-5, - - - , 965-1. The differential input buffer output signal 967 from the input buffer 956 is fed to the D input of the D-FF 965-6 and sequentially transferred to the connected D-FFs of the circuit 961 in response to the selected clock signal 959. Also, the differential input buffer output signal 967 from the input buffer 956 is fed to the D input of the D-FF 965-7 and sequentially transferred to the connected D-FFs of the circuit 963 in response to the inverted version of the clock signal 959. Therefore, the data transfer in the circuit 963 is 180° phase-shifted from that of the circuit 961. The output signals i7 and i6 of the D-FFs 965-7 and 965-6 are fed to the AND gates 958-7 and 958-6, respectively. Similarly, the output signals of the D-FFs 965-5 and 965-4, - - - , 965-1 and 965-0 are fed to the respective AND gates of the data strobe in circuit 962. Each of the AND gates 958-7, 958-6, - - - , 958-0 receives the 'idsi' signal 915. Logic output signal of each of the AND gates 958-7, 958-6, - - - , 958-0 is provided to the data register 940 that outputs the internal data signal 'Idata [0:7]' 968.

Before obtaining the ID number of the last device on the series-connected memory devices, the memory controller does not obtain any inputs from output ports of the last device. After transmitting the initial ID number ('0000', for example) the input ports of memory controller receive input data streams. The determination of the ID assignment completion is performed by the falling edge of DSI (Data Strobe In).

Once the memory controller obtains the ID number from the last device of the series-connected memory devices, the ID number is stored at the component ID register 920 through a D port 931 and the data register 940 as shown in FIG. 9B in response to the 'Latch_ID' signal 927. While this operation is being performed, DSI 932 also are received to inform the memory controller of the start and end points of the ID number. From the falling edge of the DSI signal, the 'ID_assignment_status' signal 933 determines the transition point based on a one cycle delay during which the ID number is transferred to the component ID register 920. The 'ID_assignment_status' signal 933 is provided by the control logic circuit 924 that receives the 'idsi' signal 915 from the D-FF 957. For ID generation of the memory device, DSI and DSO are used to create the ID number and transmit the ID number to the next memory device. When the 'ID_assignment_status' signal 933 is in a high state, the memory controller recognizes the end of ID generation operation: i.e., the completion of the device ID assignment.

When the 'ID_assignment_status' signal is low, then all devices have PLL on to initially assign ID numbers to all of them. When the 'ID_assignment_status' signal is high, then all IDs are assigned, and the PLL on is only applied to odd numbered devices. Therefore, this is controlled by the ID assignment status signal.

In an initial state, the memory controller does not know the information required to determine which Case exists in the serially controlled devices. For this reason, the CLK, CLK# and Q signals are provided to the controller as CK, /CK and DI as shown in FIG. 9B. Before power-up, the devices are not assigned an ID number. After power-up, the first operation is to reset the device IDs so that each device has a zero-state ID.

As shown in FIG. 9B, the 'ID_assignment_status' signal 933 and the LSB of the ID assigned to the last memory device are both provided to the AND gate 950. In response to an output of the AND gate 950, the clock selector 960 selects the clock to be output for the memory controller. The output Clk90_in of PLL 970, which is a phase shifter and clock reshaper in the example of FIG. 9B is connected to the input of clock selector 960. In one embodiment, the elements 960 and 970 can both be considered as part of the clock configurator. When the AND gate 950 detects that the ID assignment is completed, such as by detecting that the 'ID_assignment_status' signal 933 is high, the output is the LSB if the component ID register. When the ID assignment is not completed, the clock selector selects Ref_clk 953.

In ID assignment case, all PLLs of the memory devices are turned on during ID generation, and a source synchronous clock from the last device on the series-connected memory devices is center-aligned with data. The memory controller of FIGS. 9A and 9B provides a center-aligned signal or an edge-aligned signal, depending on detection of whether the ID assignment has been completed. Referring back to FIG. 9A, the memory controller includes the mode detection logic circuit 980 to detect whether an ID assignment is completed, and to generate a clock signal in response to the detection. In the example of FIG. 9A, the mode detection logic circuit 980 outputs a center-aligned clock aligned with Clk360_out 903 in response to the mode detection logic detecting that the ID assignment is not completed. The mode detection logic circuit 980 outputs an edge-aligned clock aligned with Clk270_out 907 in response to the mode detection logic detecting that the ID assignment is completed, and therefore the system is in normal operating mode.

Figure 10:
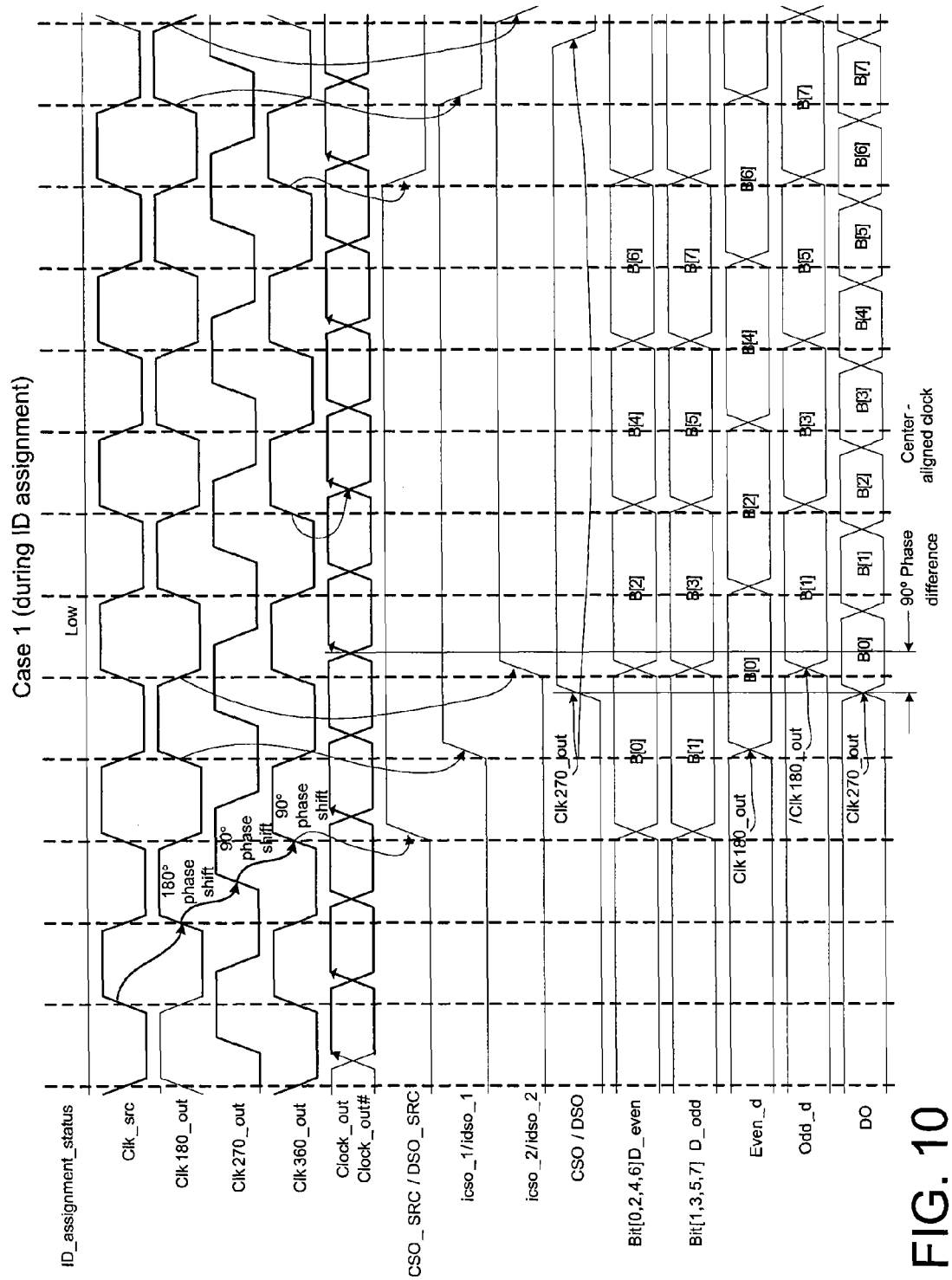
FIGS. 10 and 11 show a timing diagram of signals for the memory controller shown in FIGS. 9A and 9B.
Figure 11:
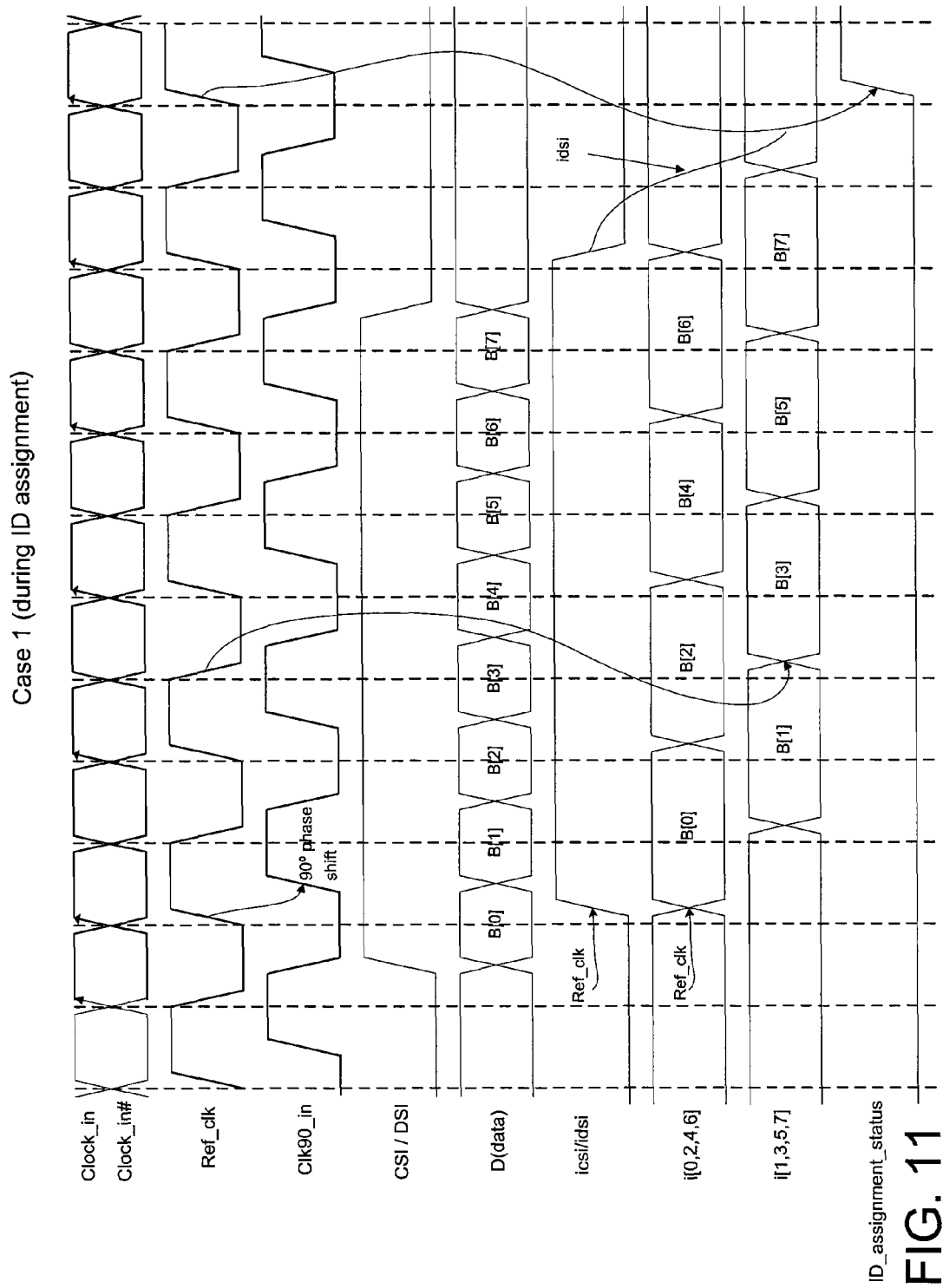

FIG. 10 and FIG. 11 show the timing diagrams during ID assignment (generation) operation. In the disclosure, the "/" sign is used for complementary signal (e.g., /clock).

Figure 12:
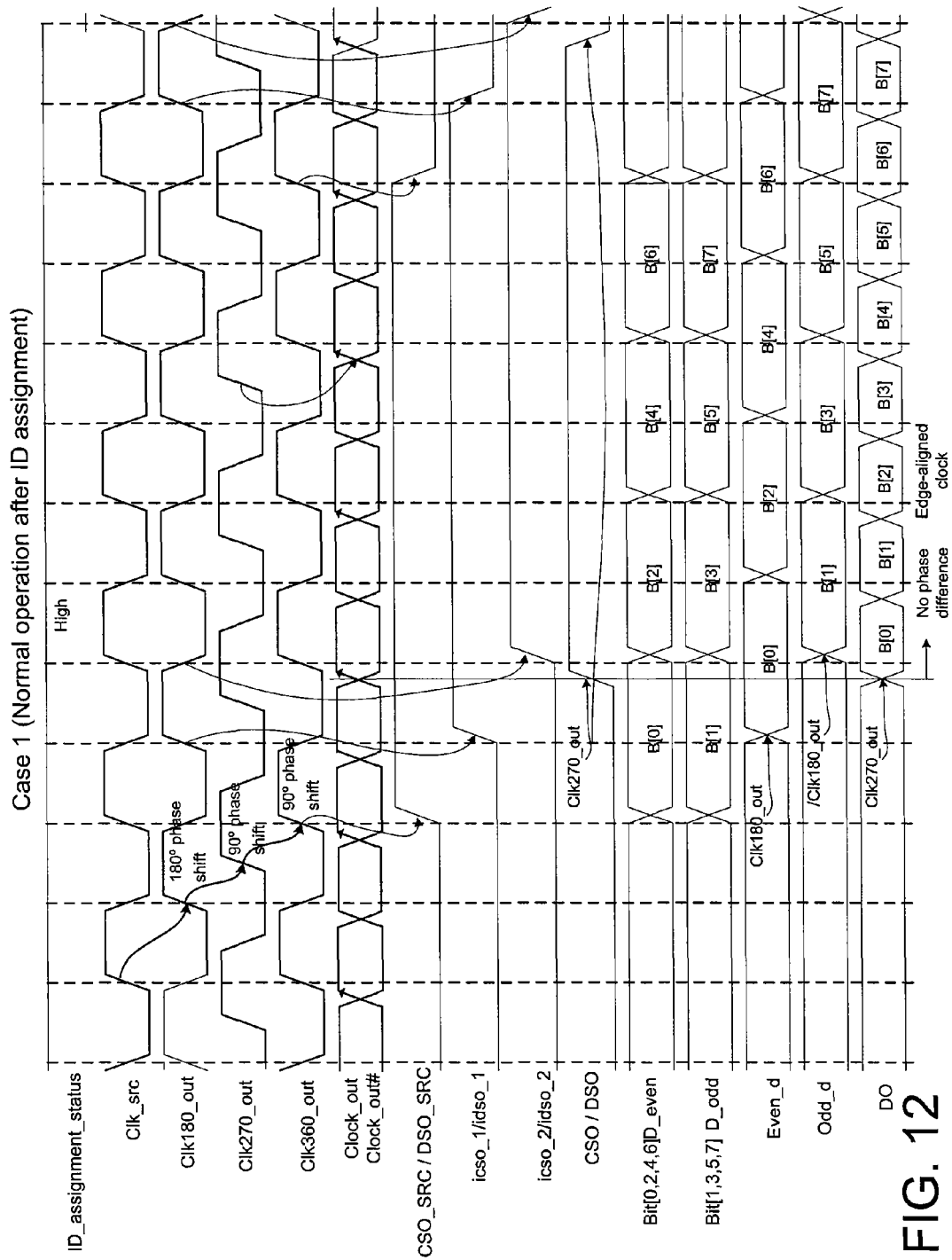
FIG. 12 shows a timing diagram of clock generation from memory controller after ID generation in accordance with an example embodiment.

FIG. 12 shows, in accordance with an example embodiment, a timing diagram of clock generation along with control outputs like CSO/DSO and DO synchronized with Clock_out and /Clock_out not being in phase difference. By the high state of 'Power_up_seq_done', clock generation path selector selects '1' input connected to 'Clk270_out' so that no phase difference is created between clock and data control & data (CSO/DSO/DO). It happens during normal operation after ID assignment.

In normal operation after ID assignment, input clock alignment to data is determined with the LSB (Least Significant Bit) of the last component ID stored at the 'Component ID register'. If LSB of ID is '0', there is no change of timing relationship between clock and data control & data. It is the same as the timing before ID generation shown in FIG. 11, except for the state change of 'ID_assignment_status' signal, the status of which changes in response to the data strobe in signal.

Figure 13:
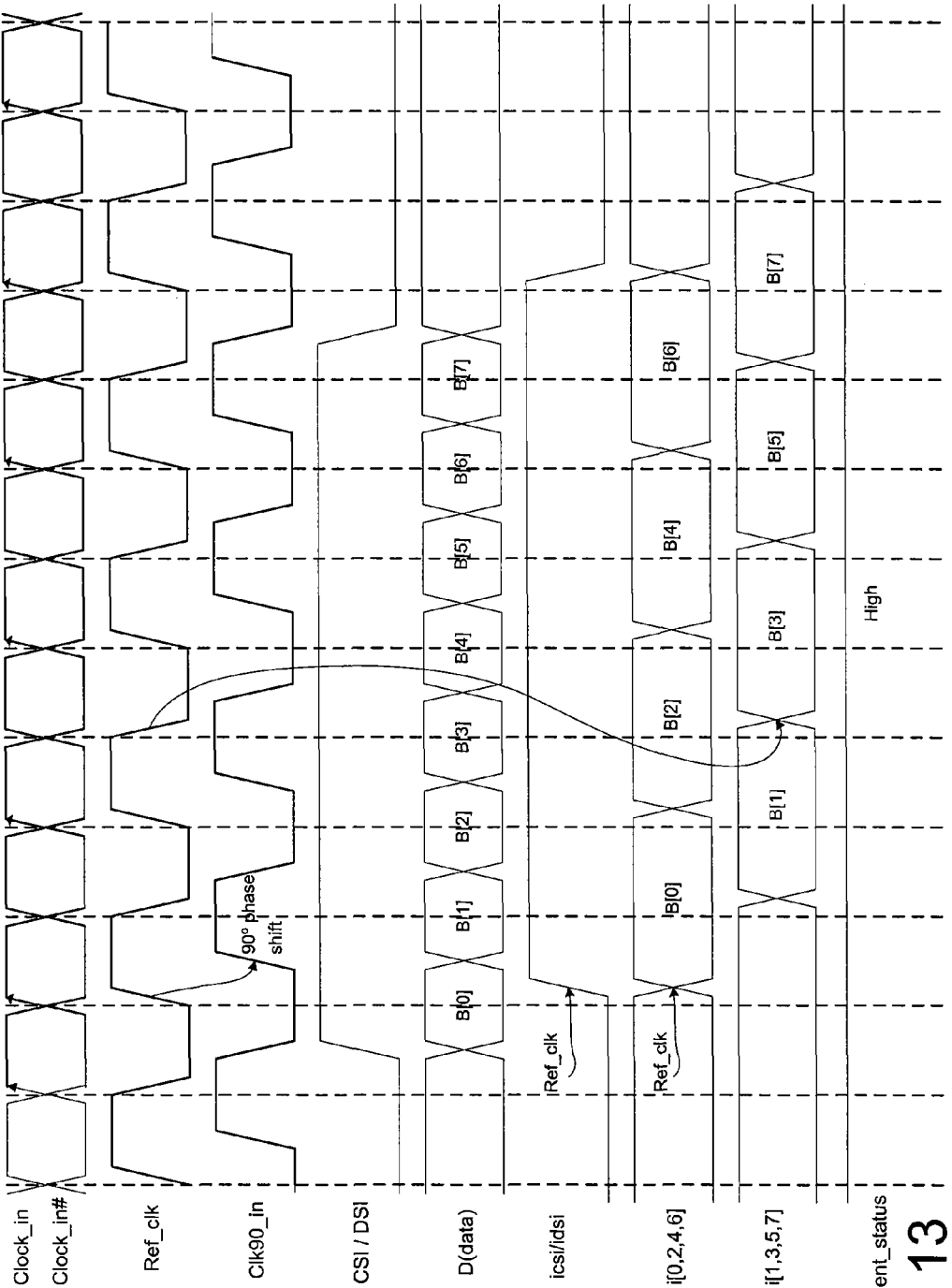
FIG. 13 shows a timing diagram of clock generation from memory controller after ID generation and least significant bit (LSB) of ID=0 in accordance with an example embodiment.

As can be seen, if the last device of the series-connected memory devices has '0' as LSB of ID, it means that the last device has on-PLL. FIG. 13 shows, in accordance with an example embodiment, a timing diagram for center-aligned clock with data, because the last device has on-PLL. In an alternate case, if the LSB of ID is '1', it means that the last device has off-PLL. So, the edge-aligned clock with data is generated from it (see First case of FIG. 6A).

As mentioned earlier, a memory controller according to an embodiment of the present invention can be different based on the Case used for alternate PLL on/off. FIGS. 9A and 9B showed a memory controller to be matched with an implementation referred to herein as Case 1.

Figure 15A:
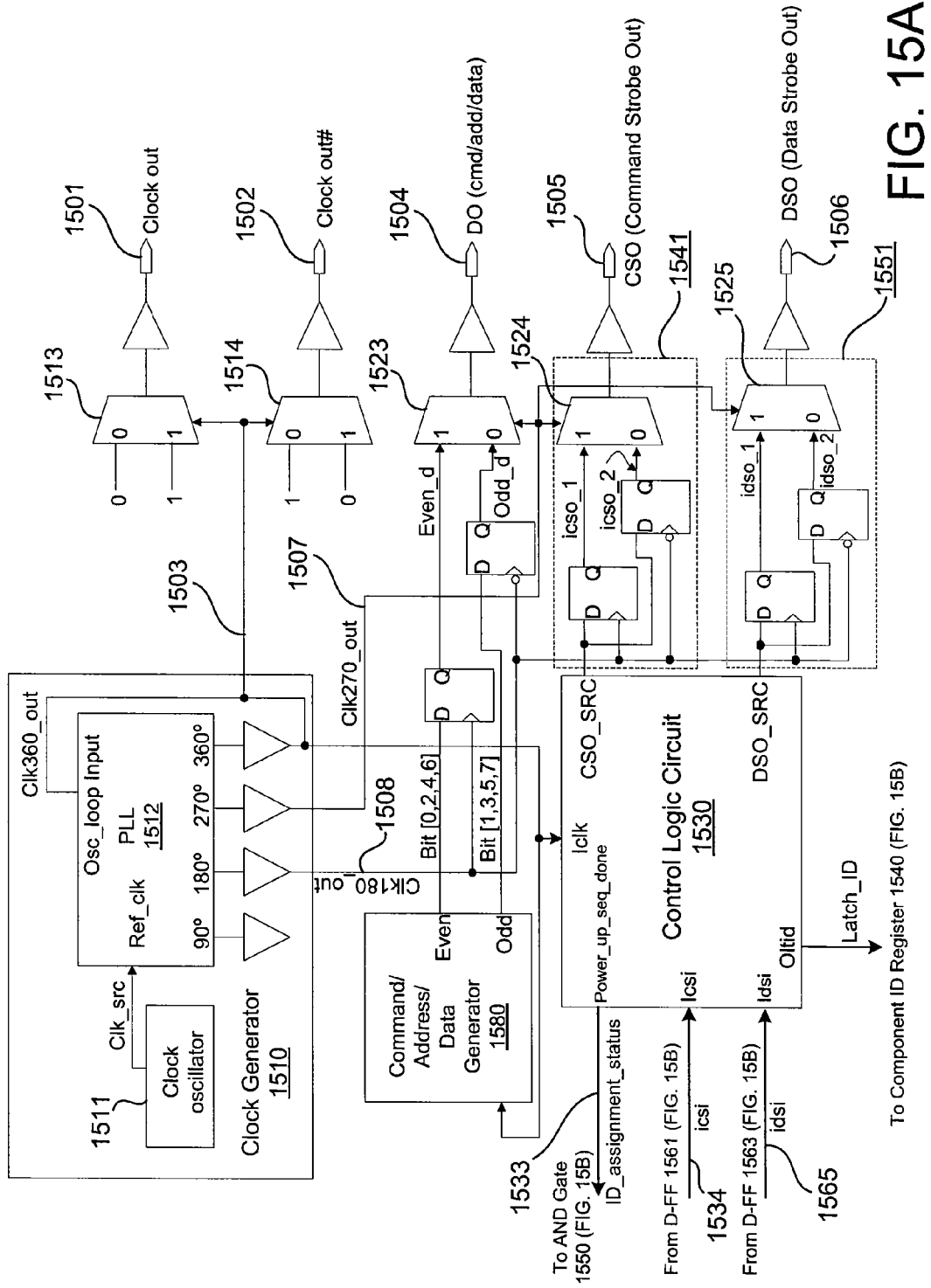
FIGS. 15A and 15B show another example of a memory controller logic configuration according to an embodiment of the present invention to support flexible data alignment.
Figure 15B:
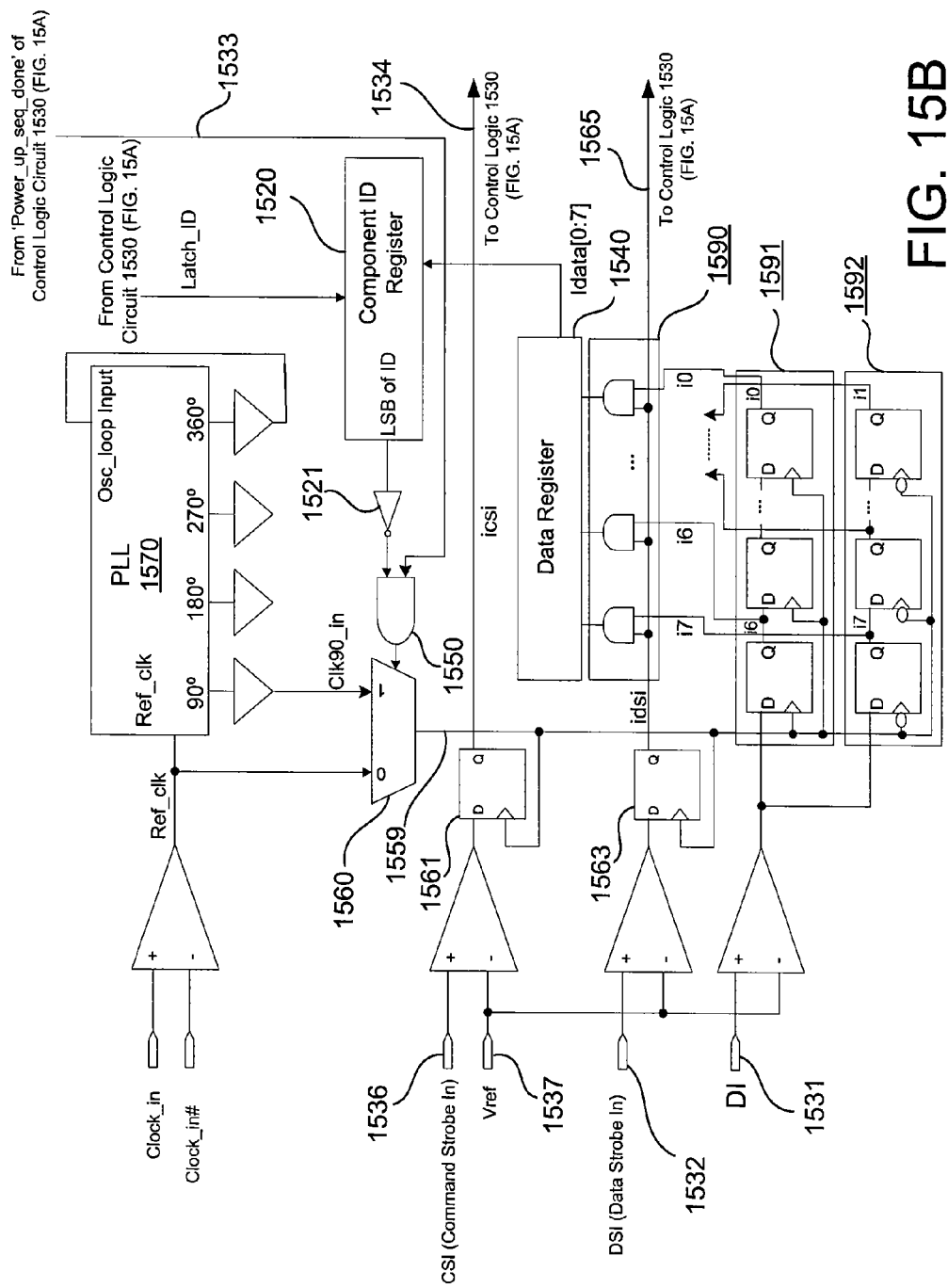

FIGS. 15A and 15B illustrate a memory controller according to an embodiment of the present invention to be matched with an implementation referred to herein as Case 2. The structure of the memory controller shown in FIGS. 15A and 15B is similar to that of FIGS. 9A and 9B. The memory controller shown in FIGS. 15A and 15B has no mode detection logic circuitry and has an additional inverter 1521 to invert the LSB of ID provided by a component ID register 1520. The timing diagram of the second case may be substantially similar to that for the first case during ID generation, because all memory devices have on-PLL (see FIG. 5).

The memory controller of FIGS. 15A and 15B, for matching with Case 2 implementation, generates a center-aligned clock and data in both ID assignment completion and normal operation. Before ID assignment, the LSB even number ON approach should be used, so that it can re-set all IDs, since all PLLs are ON in the reset phase like Case 1, so there is no need to worry about different types of operation. In Case 2, only odd numbered PLLs are turned on.

Referring to FIGS. 15A and 15B, a clock generator 1510 having a clock oscillator 1511 and a PLL 1512. An internally generated clock signal 'Clk_src' is provided by the clock oscillator 1511 to a reference clock input 'Ref_clk' of the PLL 1512 that produces a plurality of phase-shifted clock signals by 90°, 180°, 270° and 360°. The 180°, 270° and 360° phase-shifted clock signals are provided through respective output buffers as Clk180_out 1508, Clk270_out 1507 and Clk360_out 1503, respectively. The Clk180_out 1508, Clk270_out 1507 and Clk360_out 1503 are synchronized with the internally generated clock signal 'Clk_src'. The Clk360_out 1503 is provided to the selection inputs of two selectors 1513 and 1514. The "0" and "1" logic signals are fed to "0" and "1" inputs of the selector 1513 and "1" and "0" inputs of the other selector 1514, respectively. In response to the Clk360_out 1503, the selectors 1513 and 1514 provide complementary output signals that are provided through the respective output buffers as the 'Clock out' 1501 and 'Clock out#' 1502, respectively.

The Clk360_out 1503 is also provided to a command/address/data generator 1580 that provides eight-bit data of bits 0-7. The even bits [0,2,4,6] of the data are fed to a D-FF that is clocked by the Clk180_out 1508. The odd bits [1,3,5,7]

of the are provided to another D-FF that is clocked by the inverted version of the Clk180_out 1508. The two D-FFs provide even data bits 'Even_d' and odd data bits 'Odd_d' to "1" and "0" inputs of a selector 1523, respectively. The 'Odd_d' is 180° phase-shifted from the 'Even_d'. In response to the Clk270_out 1507, the selector 1523 selects the even or odd data bits. The selected data bits are provided as DO (command/address/data) 1504 through an output buffer.

A control logic circuit 1530 receives the Clk360_out 1503, an internal command strobe in signal 'icsi' 1534 from a D-FF 1561 and an internal data strobe in signal 'idsi" 1565 from a D-FF 1563. The control logic circuit 1530 provides command strobe out and data strobe out signals from its outputs CSO_SRC and DSO_SRC, respectively, which are connected to a command strobe output circuit 1541 and a data strobe output circuit 1551. The internally produced command strobe out signal is fed to two D-FFs of the command strobe output circuit 1541. The two D-FFs are clocked by the Clk180_out 1508 and its inverted version and provide output signals as 'icso_1' and 'icso_2' signals to the selector 1524, respectively. In response to the Clk270_out 1507, the selector 1524 selects one of the 'icso_1' and 'icso_2' signals and the selected signal is provided through an output buffer as the CSO 1505.

The internally produced data strobe out signal is provided from the control logic circuit 1530 to the two D-FFs of the data strobe output circuit 1551. The two D-FFs are clocked by the Clk180_out 1508 and its inverted version and provide output signals as 'idso_1' and 'idso_2' to the selector 1525. In response to the Clk270_out 1507, the selector 1525 selects one of the 'idso_1' and 'idso_2' signals and the selected signal is provided through an output buffer as the DSO (data strobe out) 1506.

The CSI 1536 is compared to the reference voltage 'Vref' 1537 by a differential input buffer. The Vref is internally generated in the memory controller itself or externally generated from a power generator (not shown). A differential buffer output signal is latched by the D-FF 1561 in response to a selected clock signal output 1559 from a selector 1560. The output signal of the D-FF 1561 is provided as the 'icsi' signal 1534 to the control logic circuit 1530.

Similarly, the DSI 1532 is compared to the reference voltage Vref 1537 by a differential input buffer and a differential buffer output signal is latched by a D-FF 1563 in response to the selected clock signal output 1559. The output signal of the D-FF 1563 is provided as the 'idsi' signal 1565 to the control logic circuit 1530 and a data strobe in circuit 1590 having eight AND gates.

Also, the data signal 'DI' 1531 is compared to the reference voltage Vref 1537 by a differential input buffer and a differential buffer output signal is provided to two data latch circuits 1591 and 1592, each including four D-FFs that are serially connected. The data of the differential buffer output signal is latched and sequentially transferred through the serially connected D-FFs in each of the two data latch circuits 1591 and 1592 in response to the selected clock signal output 1559. The D-FFs of the circuit 1592 perform the data transfer in response to the inverted clock signal. Therefore, the data transfer in the circuit 1592 is 180° phase-shifted from that of the circuit 1591. For example, the output signal i6 of the first D-FF of the circuit 1591 is 180° phase-shifted from the output signal i7 of the first D-FF of the circuit 1592. The output signals i7, i6, - - - , i1 and i0 are fed to the respective AND gates of the data strobe in circuit 1590. The eight AND gates of the data strobe in circuit 1590 commonly receive the 'idsi' signal 1565 and logic output signals of the AND gates are provided to the data register 1540 that outputs the internal data signal 'Idata[0:7]'.

The control logic circuit 1530 receives at its Icsi input the 'icsi' signal 1534 and at its Idsi input the 'idsi' signal 1599 from the D-FF 1561 and D-FF 1563, respectively. The control logic circuit 1530 at its Iclk input receives the Clk360_out 1503 from the clock generator 1510. The control logic circuit 1530 provides an ID assignment complete signal 'ID_assignment_status' signal 1533 from its Power_up_seq_done output and a latch ID signal 'Latch_ID' from its Oltid output.

In FIG. 15A, similar to FIG. 9A, to provide center-aligned clock with data from the memory controller, Clock_out 1501 and /Clock_out 1502 are synchronized with Clk360_out 1503. This synchronization is not affected by the state of the 'ID_assignment_status' signal 1533. The DO (command/address/data) 1504, CSO 1505 and DSO 1506 signals are synchronized with Clk270_out 1507. A clock generator 1510 provides the signals Clk360_out 1503 and Clk270_out 1507, such as by way of a PLL 1512. Again, the clock synchronization is not affected by the state of the 'ID_assignment_status' signal 1533, in contrast to the controller for Case 1. The memory controller of FIG. 15A does not require mode detection logic circuit 980 as in FIG. 9A, since the clock output is unchanged regardless of a change in the mode, either ID assignment mode or normal operation mode.

In FIG. 15B, the operation is similar to FIG. 9B. Once the memory controller obtains the ID number from the last device of the series-connected memory devices through a D port 1531 to the data register 1540 and the registered ID number is stored at the component ID register 1520 in response to the "Latch_ID' signal from the control logic circuit 1530. While this operation is being performed, DSI 1532 also are received to inform the memory controller of the start and end points of the ID number. From the falling edge of the DSI signal, the 'ID_assignment_status' signal 1533 determines the transition point based on a one cycle delay during which the ID number is transferred to the component ID register 1520. For ID generation of the memory device, DSI and DSO are used to create the ID number and transmit the ID number to the next memory device. When the 'ID_assignment_status' signal 1533 is in a high state, the memory controller recognizes the end of ID generation operation.

As shown in FIG. 15B, the 'ID_assignment_status' signal 1533 and the LSB of the last memory device are both provided to an AND gate 1550 which operates as a comparator. In response to an output of the AND gate 1550, the selector 1560 which operates as a clock configurator to configure the clock to be output by the memory controller. A PLL 1570 can be in communication with the selector 1560. In one embodiment, the selector 1560 and the PLL 1570 can both be considered as part of the clock configurator. The PLL 1570 of FIG. 15B performs the function of producing phase-shifted clocks as the PLL 970 of FIG. 9B. The reference clock signal 'Ref_clk' and the 90° phase-shifted clock signal 'Clk90_in' are fed to the selector 1560. The selector 1560 outputs the selected clock signal 1559 in response to an input signal fed to its selection input from the output of the AND gate 1550. When the LSB of the ID stored in the component ID register 1520 is low, the output signal of the inverter 1521 is high and then, the AND gate 1550 detects that the ID_assignment is completed, such as by detecting that the 'ID_assignment_status' signal 1533 is high. In response to the "high" output signal of the AND gate 1550, the selector 1560 selects the Clk90_in as the selected clock signal 1559. When the ID_assignment is not completed (i.e., the logic status of the 'ID_assignment_status' signal 1533 is low), the clock configurator produces the opposite output (i.e., the reference clock signal 'Ref_clk' is provided as the selected clock signal 1559). This logic determines to the clock alignment expected to be received from the last memory device, or memory component.

For Case 2, because the first device's PLL is off, an automatic detection of Case 2 is possible. For Case 1, if the first device's PLL is on, a check must be made to determine whether the ID assignment is in progress; only when the ID assignment is completed can it be determined whether Case 1 exists.

As described above, the controller can change the type of signal generation in response to detection of the Case 1 or Case 2 scenario. The set of serially connected devices typically does not have mixed settings; each device in the connected series of devices has the same settings. In a presently preferred embodiment, either all of the devices are controlled based on Case 1 or Case 2, but there cannot be a mix of the two approaches in the same series of connected devices.

The decision to use Case 1 or Case 2 is typically made by the user; the controller simply detects which implementation is being carried out. The controller can include the logic implementation for both cases, but it only implements one case at a time according to the user selection.

The user can determine the controller implementation. The embodiment in FIGS. 9A and 9B and the embodiment in FIGS. 15A and 15B are equivalent in terms of power consumption. The two different implementations can be combined into one controller, or can be implemented as separate controllers. The user will use a matched controller depending on the approach used (e.g. odd number PLLs on, or off). Each device connection should have a matched controller. The controller must match the embodiment of alternate PLL powering.

Normally, there is no need to switch from one approach to another on the fly. After power-up, the approach is chosen. The selection can be stored in memory, or can be re-done each time the device is powered up. However, to re-assign the selection upon power-up, the device IDs for all connected devices will have to be reset. The main purpose is to reduce power consumption. If one embodiment is being implemented, there is no need to switch to another embodiment.

The controller can receive, or acquire, configuration information from each device, but it only requires the configuration information for the last device, since all connected devices will have the same configuration. Based on the configuration information, the controller can detect the configuration scheme, and in response determine the appropriate clock signal to be sent.

There is no limit on the number of devices that can be connected together in one of these configurations. A limitation of known parallel clocking approaches is that even though the devices are connected as a daisy chain, due to the clock drivability and signal integrity, we cannot connect an unlimited number of devices together. According to an embodiment of the present invention, any number of devices can be connected together.

Based on the LSB of the ID of the last device, and on the number of connected devices, the controller can determine configuration information. The controller can read the configuration of the last device to determine if it is Case 1 or Case 2.

Figure 16:
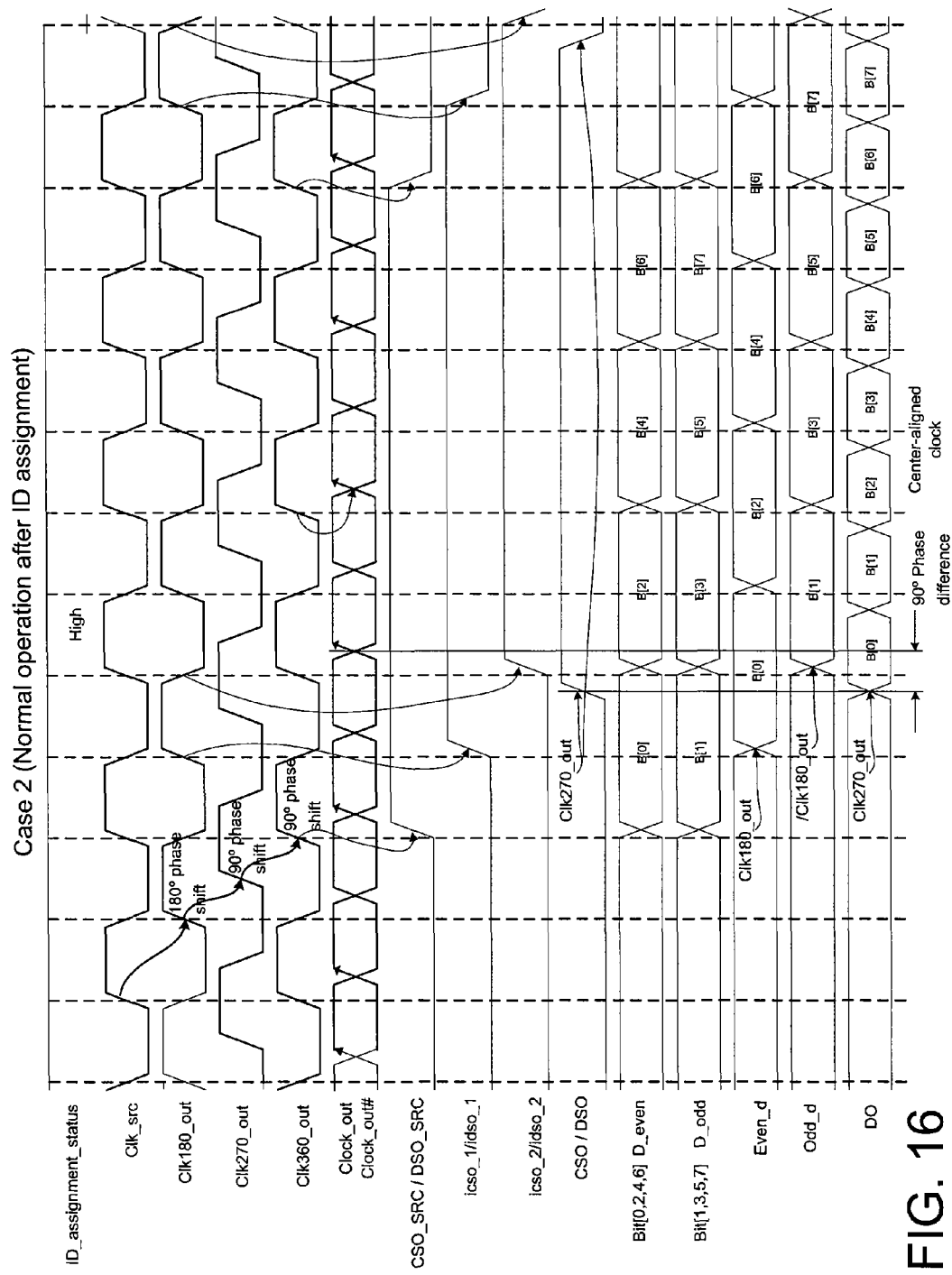
FIG. 16 shows a timing diagram of clock generation from memory controller after ID generation in accordance with an example embodiment.

FIG. 16 shows a timing diagram (Output signals, Second case) of clock generation from memory controller after ID generation in accordance with an example embodiment. For the Second case, the timing of output signals after ID assignment is substantially similar to the timing during ID assignment except for 'Power_up_seq_done'. Because output signals of the memory controller are not controlled by the state of 'Power_up_seq_done'.

Figure 17:
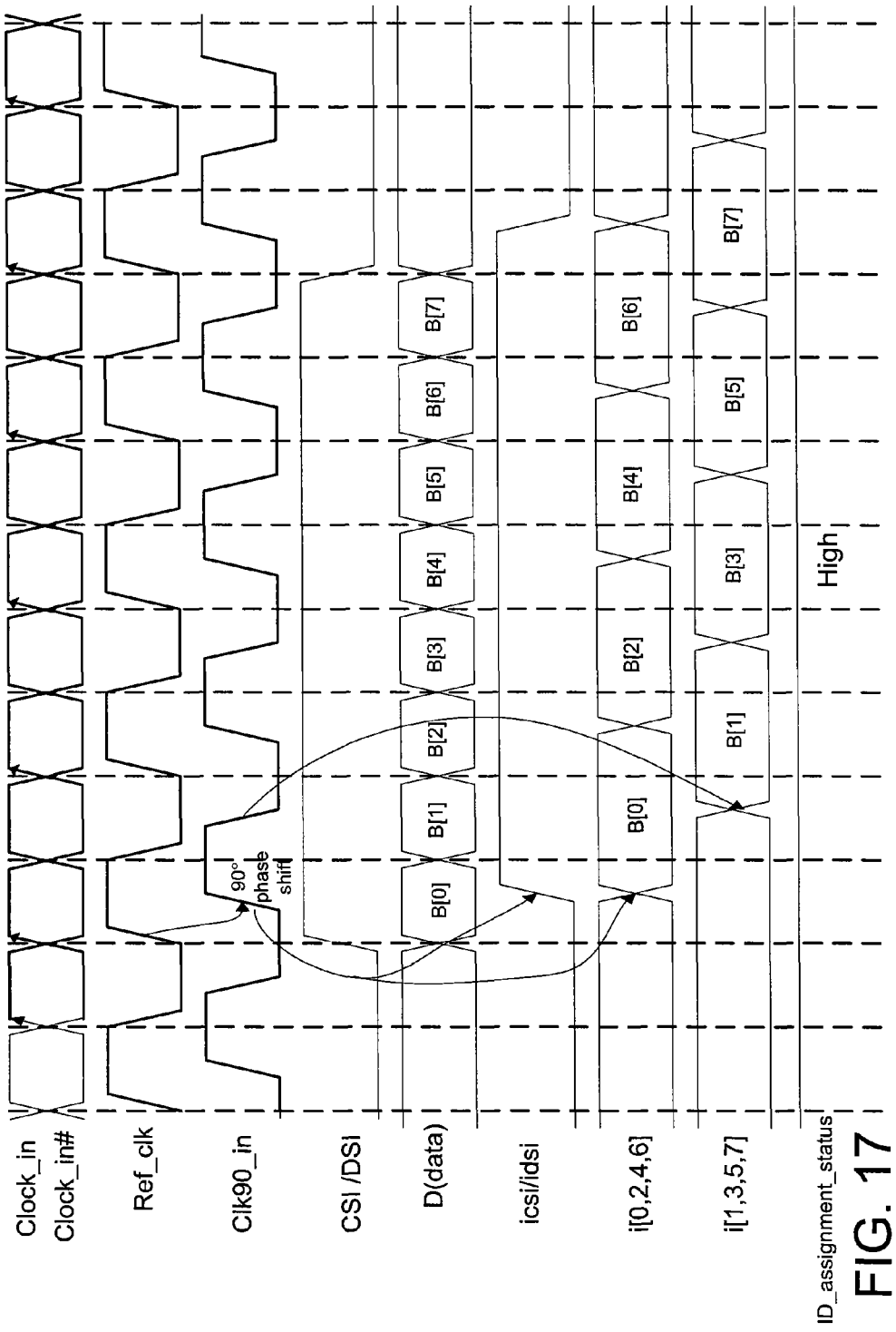
FIG. 17 shows a timing diagram of clock generation from memory controller after ID generation and LSB of ID=0 in accordance with an example embodiment.
Figure 18:
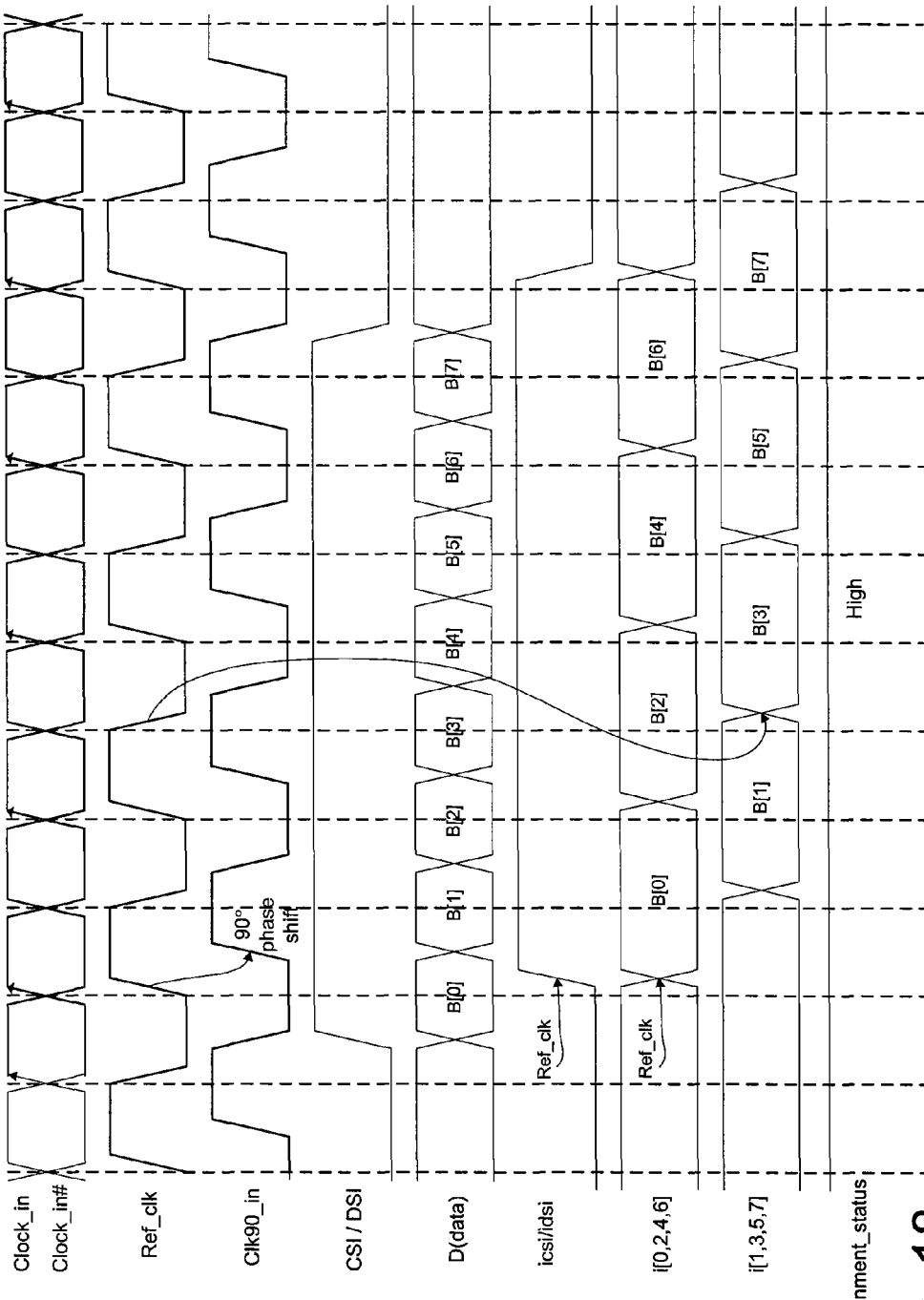
FIG. 18 shows a timing diagram of clock generation from memory controller after ID generation and LSB of ID=1 in accordance with an example embodiment.

After ID generation for the Second case, the timing diagrams with LSB of ID=0 (FIG. 17) is substantially similar to the timing of First case with LSB of ID=1 (FIG. 14). FIG. 18 with LSB of ID=1 (Second case) is same as FIG. 13 with LSB of ID=0 (First case). The multiplexer control with LSB of ID is done after inversion of LSB of ID in Second case. The differences are shown in FIGS. 9A, 9B and FIGS. 15A, 15B.

The clock structure may operate with SDR and DDR interfaces.

Embodiments of the present invention can be described as providing flexible clock alignment control of memory controller (center-aligned clock with data and edge-aligned clock with data). Using the ID number of the last device, the control of clock alignment can be determined. A different timing diagram can result before and after ID assignment, and whether LSB of ID=0 and 1. An edge alignment method can use identical delay path between clock and data control.

The embodiments described herein have referred to a plurality of devices connected in-series. Each device in the set of serially connected devices can be one physical device, or it can be a logical device including a plurality of parallel-connected physical devices. Stacked devices connected in series are each assigned their own ID number, and are represented as separate devices, as shown in FIGS. 6A and 6B.

For example, if three parallel connected devices are provided in the middle of a plurality of series connected devices, those three parallel connected devices are seen as one logical device with respect to powering or controlling the PLL according to an embodiment of the present invention. Therefore, it is possible to have parallel-connected devices, but each set of parallel-connected devices is treated as one logical device. If a logical device, including a plurality of parallel-connected devices, needs to have its PLL turned on, then only one PLL in the plurality of parallel-connected devices needs to have its PLL turned on. Turning on other PLLs is possible, but will unnecessarily increase power consumption.

According to an embodiment of the present invention, the PLLs of alternating serially connected devices are turned on, whether the devices are logical devices or physical devices, and regardless of the total number of devices. Embodiments of the present invention describe a method of controlling the device connections.

Alternatives to the on/off/on/off (or off/on/off/on) approaches of alternate PLL powering are possible, but would be more difficult, and would likely require additional circuitry. The maximum frequency will likely be limited according to such other approaches. For example, if all PLLs except one are turned off, the system operation is not possible.

Using source synchronous signaling, the connection is only from one device to the next device, which can be considered to be a point-to-point connection. Point-to-point connections guarantee high frequency operation.

In the examples described above, the device, elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for operation of the devices or apparatus. Thus, in actual configuration, the devices, elements and circuits are directly or indirectly coupled with or connected to each other.

The above-described and -illustrated examples of the present invention are intended to be examples only. Alterations, modifications and variations may be effected to the particular embodiments by those of skill in the art without departing from the scope of the present invention, which is defined solely by the claims appended hereto.

What is claimed is:

1. An apparatus for communicating with a plurality of devices connected in-series that employs source synchronous clocking, at least one of the series-connected devices being associated with a unique device identifier (ID), the apparatus comprising:
    an identifier detector configured
        to detect the device ID associated with the at least one of the series-connected devices, and
        to provide detected number information based on the detected device ID,
    the identifier detector comprising a bit information detector configured to detect bit content information on one of bits included in the detected device ID; and
    a clock producer configured to produce a clock signal in response to the detected number information, the produced clock signal being used for synchronizing communication between the apparatus and the devices.

2. The apparatus of claim 1 wherein the bit information detector comprises:
    a bit number determiner configured to:
        detect whether a least significant bit (LSB) of the detected device ID is "1" or "0" and
        provide a determination result as the detected number information, an aligned clock signal being produced in response to the determination result.

3. The apparatus of claim 2 wherein the bit number determiner comprises:
    a register configured to store the bits of the device ID associated with the at least one of the series-connected devices; and
    a bit determiner configured to detect whether the LSB of the stored device ID is "1" or "0".

4. The apparatus of claim 3 further comprising:
    a mode detector configured to
        receive a signal representing the status of completion of ID assignment,
        determine whether the ID assignment is completed and
        provide the status of the ID assignment completion to the bit determiner to determine the LSB of the registered device ID.

5. The apparatus of claim 1 wherein the clock producer produces either edge-aligned or center-aligned clock signal with data in response to detection that an device identifier assignment is completed, the apparatus providing a strobe signal for controlling data input to and output from the device, the data being transmitted in synchronization with the clock signal.

6. The apparatus of claim 3 wherein the at least one of the series-connected devices comprises a last device of the series-connected devices.

7. The apparatus of claim 1 wherein the bit information detector is configured to detect a value of one of the bits included in the detected device ID.

8. A method for communicating with a plurality of devices connected in-series that employs source synchronous clocking, at least one of the series-connected devices being associated with a unique device identifier (ID), the method comprising:
    detecting the device ID associated with the at least one of the series-connected devices to provide detected number information based on the detected device ID;
    detecting bit content information on one of bits included in the detected device ID; and
    producing a clock signal in response to the detected number information, the produced clock signal being used for synchronizing the communication with devices.

9. The method of claim 8 wherein the detecting information comprises:
    determining whether a least significant bit (LSB) of the detected device ID is "1" or "0"; and
    providing a determination result as the detected number information, an aligned clock signal being produced in response to the determination result.

10. The method of claim 9 wherein the determining comprises:
    receiving the bits of the device ID associated with the at least one of the series-connected devices; and
    determining whether the LSB of the received device ID is "1" or "0" to produce a determination result, either edge-aligned or center-aligned clock signal with data being produced in response to the determination result.

11. The method of claim 8 wherein the producing comprises:
    producing either edge-aligned or center-aligned clock signal with data, and wherein the method further comprises:
    providing a strobe signal for controlling data input to and output from the device, the data being transmitted in synchronization with the clock signal.

12. The method of claim 10 wherein the at least one of the series-connected devices comprises a last device of the series-connected devices.

13. The method of claim 8 wherein detecting bit content information comprises detecting a value of one of the bits included in the detected device ID.

14. A system comprising:
    a plurality of series-connected devices that employs source synchronous clocking, at least one of the series-connected devices being associated with a unique device identifier (ID); and
    a controller configured to communicate with the series-connected devices, the controller including:
        an identifier detector configured
            to detect the device ID associated with the at least one of the series-connected devices, and
            to provide detected number information based on the detected device ID;
        the identifier detector comprising a bit information detector configured to detect bit content information on one of bits included in the device ID that is represented by a binary code; and
        a clock producer configured to produce a clock signal in response to the detected number information, the produced clock signal being used for synchronizing communication between the controller and the devices.

15. The system of claim 14 wherein the bit information detector comprises:
    a bit number determiner configured to detect whether a least significant bit (LSB) of the device ID is "1" or "0" and providing a determination result as the detected number information, an aligned clock signal being produced in response to the determination result.

16. The system of claim 15 wherein the bit number determiner comprises:
    a register configured to store the bits of the device ID associated with the at least one of the series-connected devices; and a bit determiner whether the LSB of the stored device ID is "1" or "0".

17. The system of claim 16 wherein the at least one of the series-connected devices comprises a last device of the series-connected devices.

18. The system of claim 14 wherein the bit information detector is configured to detect a value of one of the bits included in the detected device ID.

* * * * *